(12) United States Patent
Forrest et al.

(10) Patent No.: US 11,302,881 B2
(45) Date of Patent: Apr. 12, 2022

(54) METHOD OF IMPROVING EXCITON DISSOCIATION AT ORGANIC DONOR-ACCEPTOR HETEROJUNCTIONS

(75) Inventors: Stephen R. Forrest, Ann Arbor, MI (US); Noel C. Giebink, Downers Grove, IL (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/099,716

(22) Filed: May 3, 2011

(65) Prior Publication Data

US 2011/0297234 A1 Dec. 8, 2011

Related U.S. Application Data

(60) Provisional application No. 61/331,798, filed on May 5, 2010.

(51) Int. Cl.
*H01L 31/00* (2006.01)
*H01L 51/00* (2006.01)
*H01L 51/42* (2006.01)

(52) U.S. Cl.
CPC ........ *H01L 51/4253* (2013.01); *H01L 51/001* (2013.01); *H01L 51/0046* (2013.01); *H01L 51/0047* (2013.01); *H01L 51/0054* (2013.01); *H01L 51/0055* (2013.01); *H01L 51/0078* (2013.01); *H01L 51/0091* (2013.01); *Y02E 10/549* (2013.01)

(58) Field of Classification Search
CPC ............. H01L 51/4253; H01L 51/0055; H01L 51/0078; H01L 51/0091; Y02E 10/549

USPC ............................................ 136/263; 438/82
See application file for complete search history.

(56) References Cited

U.S. PATENT DOCUMENTS

| | | | |
|---|---|---|---|
| 2005/0224113 A1 | 10/2005 | Xue et al. | |
| 2005/0227390 A1 | 10/2005 | Shtein et al. | |
| 2006/0060239 A1* | 3/2006 | Peumans et al. | ............. 136/263 |
| 2007/0215868 A1* | 9/2007 | Forrest | ................... B82Y 10/00 |
| | | | 257/40 |
| 2008/0116536 A1* | 5/2008 | Forrest et al. | ................ 257/431 |
| 2011/0132440 A1* | 6/2011 | Sivarajan | ............. H01L 51/426 |
| | | | 136/252 |

FOREIGN PATENT DOCUMENTS

| WO | WO 2009/029548 A1 | 3/2009 |
|---|---|---|
| WO | WO 2010/036963 A1 | 4/2010 |

OTHER PUBLICATIONS

Yang et al., "Nanoscale Morphology of High-Performance Polymer Solar Cells", Nano Letters, 2005.*
International Search Report from PCT/US2011/035017.
Perez, M. Dolores et al., "Molecular and Morphological Influences on the Open Circuit Voltages of Organic Photovoltaic Devices," J. Am. Chem. Soc. 2009, 131, pp. 9281-9286.

* cited by examiner

*Primary Examiner* — Angelo Trivisonno
(74) *Attorney, Agent, or Firm* — Finnegan, Henderson, Farabow, Garrett & Dunner, LLP

(57) ABSTRACT

The present disclosure generally relates to organic photosensitive optoelectronic devices and polaron pair recombination dynamics to impact efficiency and open circuit voltages of organic solar cells. The present disclosure also relates, in part, to methods of making organic photosensitive optoelectronic devices comprising the same.

22 Claims, 13 Drawing Sheets

METHOD OF IMPROVING EXCITON DISSOCIATION AT ORGANIC DONOR-ACCEPTOR HETEROJUNCTIONS

CROSS-REFERENCE TO RELATED APPLICATION

This application claims the benefit of U.S. Provisional Application No. 61/331,798, filed May 5, 2010, which is incorporated herein by reference in its entirety.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

STATEMENT REGARDING FEDERALLY SPONSORED RESEARCH

This invention was made with U.S. Government support under Contract No. DE-SC0000957 awarded by the Department of Energy and FA9550-07-1-0364 awarded by the Air Force Office of Scientific Research. The government has certain rights to this invention.

FIELD OF THE DISCLOSURE

The present disclosure generally relates to organic photosensitive optoelectronic devices and polaron pair recombination dynamics to impact efficiency and open circuit voltages of organic solar cells. The present disclosure also relates, in part, to methods of making organic photosensitive optoelectronic devices comprising the same.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max}V_{max}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff^*(I_{SC}^*V_{OC})P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

The current-voltage characteristics of organic heterojunctions are often modeled using the generalized Shockley equation derived for inorganic diodes. However, since the Shockley equation does not rigorously apply to organic semiconductor donor-acceptor (D-A) heterojunctions (HJs), the extracted parameters lack a clear physical meaning.

Without wishing to be bound by theory, a mathematical derivation for the current density-voltage (J-V) characteristics directed to D-A HJ solar cells is provided. This derivation predicts the general dependence of dark current, open-circuit voltage ($V_{OC}$), and short-circuit current ($J_{SC}$) on temperature and light intensity as well as the maximum $V_{OC}$ for a given D-A material pair. Also provided herein is the investigation of $k_{PPr}$ at $CuPc/C_{60}$ and $SubPc/C_{60}$ HJs into PP dynamics in archetype planar organic solar cells comprising, for example, copper phthalocyanine and boron subphthalocyanine chloride donor-acceptor pairs.

Due to the disorder at the D-A interface, trap-limited recombination leads to the introduction of two temperature-dependent ideality factors. Such factors describe the dark current of copper phthalocyanine/$C_{60}$ and boron subphthalocyanine/$C_{60}$ cells at low temperature, and fits to the generalized Shockley equation break down. As described in detail below, one embodiment of the present disclosure identifies the polaron pair recombination rate as a key factor that determines the J-V characteristics in the dark and under illumination and provides direct measurements of this process. These results provide a general physical framework for interpreting the J-V characteristics and understanding the efficiency of both small molecule and polymer organic, planar and bulk HJ solar cells.

SUMMARY

There is disclosed an organic photosensitive optoelectronic device comprising:
  two electrodes comprising in superposed relation;
  at least one donor material, and
  at least one acceptor material,
  the at least one donor material and at least one acceptor material forming at least one photoactive region between the two electrodes, wherein the at least one donor material and at least one acceptor material are ordered in their bulk and comprise a disordered region at their interface.

There is also disclosed a method of making an organic photosensitive optoelectronic device, the method comprising depositing onto a substrate,
  at least one donor material,
  at least one acceptor material, and
  at least one electrode,
  wherein the at least one donor material and at least one acceptor material are deposited to form at least one photoactive region between the two electrodes,
  wherein the at least one donor material and at least one acceptor material are ordered in their bulk and comprise a disordered region at their interface.

The foregoing and other features of the present disclosure will be more readily apparent from the following detailed description of exemplary embodiments, taken in conjunction with the attached drawings. It will be noted that for convenience all illustrations of devices show the height dimension exaggerated in relation to the width.

The current density vs. voltage (J-V) characteristics of organic semiconductor heterojunctions are often similar to those of inorganic p-n junctions. As a consequence, theoretical treatments based on the generalized Shockley Equation originally derived for inorganic devices, have been extended to model the operation of organic solar cells. See, e.g., W. Shockley, Bell Syst. Tech. J. 28, 435 (1949); W. Shockley, *Electrons and Holes in Semiconductors* (D. Van Nostrand, Inc., New York, 1950); V. Dyakonov, Appl. Phys. A 79, 21 (2004); W. J. Potscavage, S. Yoo, and B. Kippelen, Appl. Phys. Lett. 93, 193308 (2008); B. P. Rand, D. P. Burk, and S. R. Forrest, Phys. Rev. B 75, 115327 (2007); and N. Li, B. E. Lassiter, R. R. Lunt, G. Wei, and S. R. Forrest, Appl. Phys. Lett. 94, 023307 (2009).

This phenomenological approach often yields a reasonably accurate description, although it fails in some cases and obscures the inherently different physics of organic semiconductors whose understanding would lead to a richer, more rigorous picture of these structures.

The Shockley Equation is derived for inorganic p-n junctions with well-developed energy band structure where thermal and optical excitation results in delocalized free charge carriers. In contrast, organic semiconductors are generally characterized by hopping transport and tightly bound, localized exciton states that require significant energy to dissociate into free charge carriers. Thus, in one aspect, the need exists to develop an ideal diode equation specifically for the case of organic heterojunctions (HJs).

By explicitly treating polaron pair generation, recombination and dissociation at the HJ, provided herein is a current-voltage characteristic similar in form to the Shockley equation as described in S. M. Sze, *Physics of Semiconductor Devices* (John Wiley & Sons, New York, 2005), but differing in several key aspects. First, it predicts the temperature dependence of the dark current, the intensity and temperature dependence of the open circuit voltage ($V_{oc}$) and short-circuit current ($J_{sc}$), and the maximum $V_{oc}$ attainable for a given small molecule or polymer HJ material pair. Additionally, and without wishing to be bound by theory, the diode ideality factor arose from recombination via disorder-induced traps at the heterointerface, and analytically treats the case in which these traps have an exponential energetic distribution extending into the energy gap between the highest occupied (HOMO) and lowest unoccupied molecular orbitals (LUMO). This model, applies to, for example, data obtained for two archetype, planar HJ organic photovoltaic cells composed of copper phthalocyanine (CuPc) and boron subphthalocyanine chloride (SubPc) donors, and a fullerene (such as, for example, C$_{60}$) acceptor.

Figure 1:
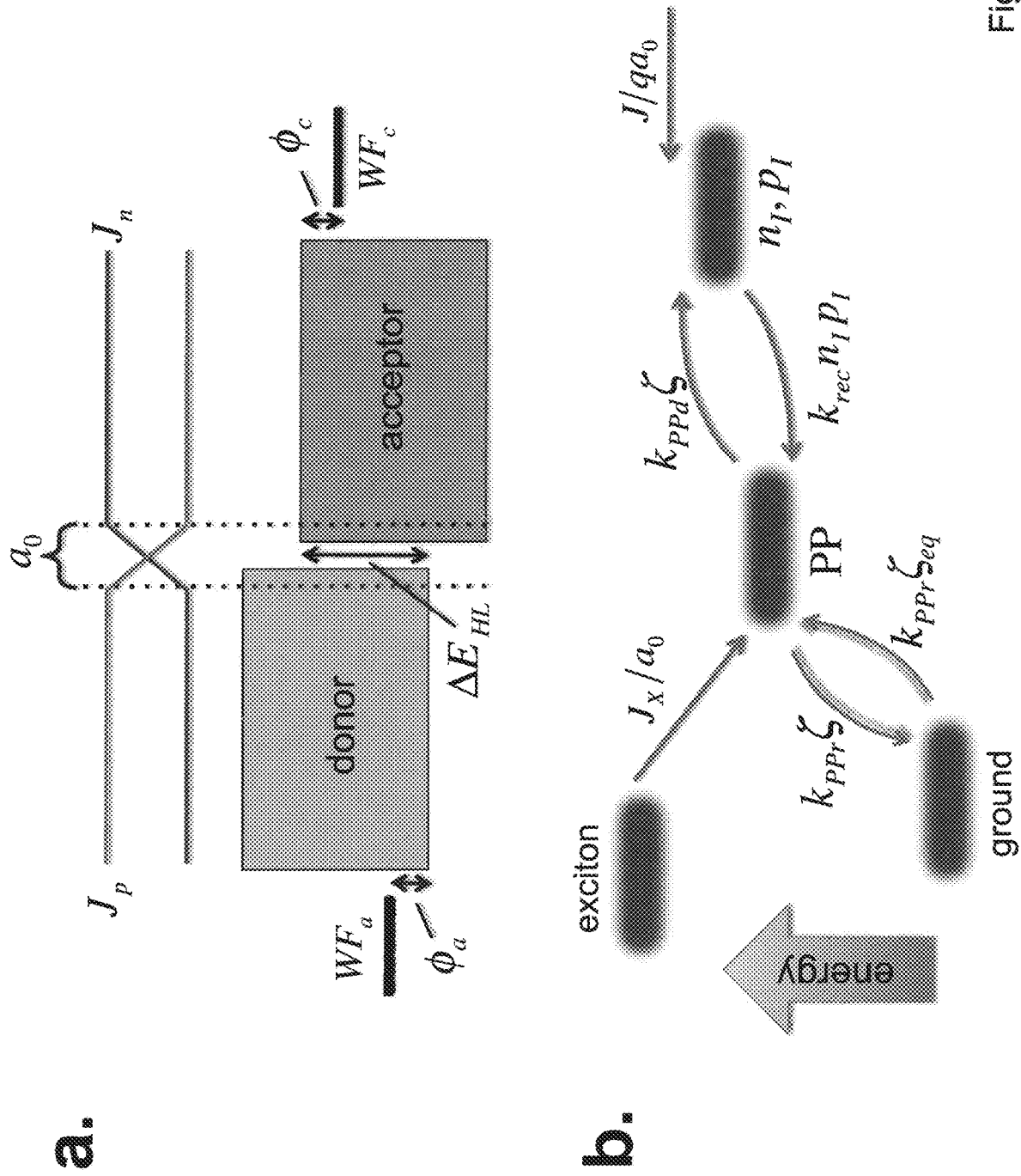
FIG. 1. (a) represents an energy level diagram showing the anode and cathode work functions, $WF_a$ and $WF_c$, and their associated injection barriers $\phi_a$ and $\phi_c$, respectively. The interfacial gap, $\Delta E_{HL}$, is the energy difference between the highest occupied molecular orbital energy of the donor and the lowest unoccupied molecular orbital energy of the acceptor. Current is unipolar in the donor ($J_P$) and acceptor ($J_n$) layers, and is determined from generation/recombination in the heterojunction (HJ) region, roughly defined by the spatial extent, $a_0$, of the polaron pair distribution at the interface. (b) Represents the processes occurring within the HJ region. Excitons diffuse, with current density, $J_X$, to the HJ and undergo charge transfer to form polaron pairs. These may recombine, at rate $k_{PPr}$, or dissociate with rate, $k_{PPd}$, as determined by the Onsager-Braun model (C. L. Braun, J. Chem. Phys. 80, 4157 (1984)). The current density, $J$, contributes to the interfacial free electron ($n_I$) and hole ($p_I$) densities, which bimolecularly recombine to form polaron pairs at rate $k_{rec}$.

The treatment described herein assumes that current is governed solely by generation and recombination at the heterojunction, and that both processes proceed through the polaron pair (PP) intermediate state. The average polaron pair separation, $a_0$, thus defines the 'volume' of the heterojunction region, as shown in FIG. 1a. Current outside of this region is unipolar, with pure hole and electron currents flowing in the donor and acceptor bulk, respectively.

The schematic in FIG. 1a also defines the energetics, where the interfacial gap, $\Delta E_{HL}$, is the difference between donor HOMO and acceptor LUMO along with any shift due to formation of an interface dipole. The hole and electron injection barriers at the anode and cathode are $\phi_a$ and $\phi_c$, respectively, again including any interface dipoles, and the built-in potential of the device is given by the corresponding difference in contact work functions: $V_{bi}$=WF$_a$−WF$_c$.

FIG. 1b shows the processes that occur within the HJ volume. The recombination of polaron pairs is described via:

$$\frac{J_X}{a_0} - k_{PPr}(\zeta - \zeta_{eq}) - k_{PPd}\zeta + k_{rec}n_I p_I = 0, \quad (1)$$

and for free carriers:

$$k_{PPd}\zeta - k_{rec}n_I p_I + \frac{J}{qa_0} = 0, \quad (2)$$

where steady-state conditions are assumed. Here, $\zeta$ is the PP density, $J_X$ is the exciton current density diffusing to the interface, J is the charge current density flowing through the device, q is the electron charge, and $n_I$ and $p_I$ are the interfacial free electron and hole densities, respectively. Definitions of select variables used in this section are summarized in Table 1.

Polaron pairs recombine to the ground state at rate $k_{PPr}$, which is also linked to the thermal equilibrium PP population, $\zeta_{eq}$, determined by detailed balance. See, e.g., T. Kirchartz, B. E. Pieters, K. Taretto, and U. Rau, J. Appl. Phys. 104, 094513 (2008). Polaron pairs dissociate at rate $k_{PPd}$, which is a function of temperature and the electric field at the interface according to the Onsager-Braun model (C. L. Braun, J. Chem. Phys. 80, 4157 (1984)), see Calculation of the Interfacial Electric Field below.

Finally, free carriers bimolecularly recombine to form PPs with rate constant, $k_{rec}$, approximated by its bulk Langevin value, $q\mu_{tot}/\varepsilon$, as described in M. Pope and C. E. Swenberg, *Electronic Processes in Organic Crystals and Polymers* (Oxford University Press, New York, 1999) and C. Groves and N. C. Greenham, Phys. Rev. B 78, 155205 (2008).

Here, $\mu_{tot}$ is the sum of the electron and hole mobilities in the acceptor and donor layers, respectively, and $\varepsilon$ is the average permittivity.

Solving Eq. (1) for the PP density and substituting the result into Eq. (2) gives:

$$J = qa_0 k_{rec}\left(\frac{k_{PPr}}{k_{PPd}+k_{PPr}}\right)\left(n_I p_I - \frac{k_{PPd}}{k_{PPd,eq}}n_{I,eq}\right) - qJ_X\left(\frac{k_{PPd}}{k_{PPd}+k_{PPr}}\right), \quad (3)$$

using $\zeta_{eq} = k_{rec} n_{I,eq} P_{I,eq}/k_{PPd,eq}$ from Eq. (2). The subscript eq indicates the thermal equilibrium value in the absence of bias or illumination. Similar to the Shockley Equation, quasi-equilibrium is assumed. Hence, the carrier densities at the interface ($n_I$, $p_I$) and contacts ($n_c$, $p_c$) are related via:

$$n_I = n_C \exp\left[\frac{\delta_A q(V_a - V_{bi})}{k_b T}\right] \text{ and} \quad (4a)$$

$$p_I = p_C \exp\left[\frac{\delta_D q(V_a - V_{bi})}{k_b T}\right], \quad (4b)$$

where $\delta_D + \delta_A = 1$ are the fractions of the potential dropped across the donor (D) and acceptor (A) layers, respectively. Here, $V_a$ is the applied bias, $k_b$ is Boltzmann's constant, and T is the temperature. These relations are strictly valid only when J=0, but are a good approximation at low current when J is much smaller than either of its drift or diffusion components.

Use of Eqs. (4) in Eq. (3) yields:

$$J = qa_0 k_{rec} n_C p_C (1-\eta_{PPd}) \exp(-qV_{bi}/k_b T) \quad (5)$$

$$\left\{\exp(qV_a/k_b T) - \frac{k_{PPd}}{k_{PPd,eq}}\right\} - q\eta_{PPd} J_X,$$

where $\eta_{PPd} = k_{PPd}/(k_{PPd}+k_{PPr})$ is the PP dissociation probability. Assuming detailed balance of the charge density adjacent to an injecting contact:

$$n_c = f(F_c, T) N_{LUMO} \exp(-\phi_c/k_b T), \quad (6)$$

where $N_{LUMO}$ is the density of states (DOS) at the acceptor LUMO, and $F_c$ is the electric field at the cathode contact. The analogous relation involving the injection barrier, $\phi_a$, (see FIG. 1a) exists for holes at the anode, with $N_{HOMO}$ as the DOS at the donor HOMO. The term, $f(F_c,T)$ is dominated by Schottky barrier lowering; since it is near unity except for the case of high field and/or low temperature, it's neglected here. Thus, the ideal diode equation for an organic HJ in the absence of traps is:

$$J = qa_0 k_{rec} N_{HOMO} N_{LUMO} (1-\eta_{PPd}) \quad (7)$$

$$\exp(-\Delta E_{HL}/k_b T)\left\{\exp(qV_a/k_b T) - \frac{k_{PPd}}{k_{PPd,eq}}\right\} - q\eta_{PPd} J_X =$$

$$J_{s0}\left\{\exp(qV_a/k_b T) - \frac{k_{PPd}}{k_{PPd,eq}}\right\} - q\eta_{PPd} J_X,$$

where $\Delta E_{HL} = \phi_a + \phi_c + qV_{bi}$ from FIG. 1a. This equation carries an implicit dependence on temperature and the interfacial electric field through $\eta_{PPd}(F_I,T)$, and consequently $\eta_{PPd}$. The solution for these terms is provided in Calculation of the Interfacial Electric Field below.

In the absence of illumination ($J_X=0$), Eq. (7) represents the ideal organic HJ current density-voltage relationship. Compared to the Shockley Equation, the prefactor of the bracketed term is analogous to the dark saturation current (called $J_{s0}$ here), whose temperature dependence is predominantly exponential in $\Delta E_{HL}$. For $V_a<0$, the interfacial field is high and aids dissociation. Thus, $k_{PPd}$ grows larger than $k_{PPd,eq}$ and the reverse saturation current increases with increasing reverse bias, as typically observed in organic HJs. Under forward bias, $k_{PPd}$ is similar to or less than $k_{PPd,eq}$ and the current density increases exponentially with an ideality factor n=1. In this case, Eq. (7) reduces to the familiar:

$$J = J_{s0}\{\exp(qV_a/k_b T) - 1\} - q\eta_{PPd} J_X \quad (8)$$

frequently used to model organic HJ solar cells. As expected, the photocurrent (last term on the right) is directly proportional to the PP dissociation efficiency, which diminishes with increasing forward bias.

Solving Eq. (7) for the open-circuit voltage gives:

$$qV_{oc} = \Delta E_{HL} - k_b T \ln\left[\left(\frac{k_{PPr}}{k_{PPd}}\right)\frac{k_{rec} N_{HOMO} N_{LUMO}}{J_X/a_0}\right]. \quad (9)$$

Equation (9) predicts that $V_{OC}$ should increase with decreasing temperature, and that it should increase as the logarithm of $J_X$ (proportional to intensity) with slope $k_b T/q$. When polaron pairs are strongly coupled to the ground state, $k_{PPr}$ is large and $V_{OC}$ decreases. At $V_{OC}$, the interfacial field, $F_I$, is small or even reverses direction (i.e. aiding recombination). In this case, $k_{PPd}$ takes on its zero-field value, $k_{PPd} \approx [3k_{rec}/4\pi a_0^3] \exp(-E_B/k_b T)$, where $E_B$ is the polaron pair binding energy.

Recognizing $4B a_0^3/3$ as the volume occupied by a polaron pair, this relationship may be inserted into Eq. (9) to give:

$$qV_{oc} = (\Delta E_{HL} - E_B) - k_b T \ln\left[\frac{k_{PPr} N_{HOMO} N_{LUMO}}{\zeta_{max} J_X/a_0}\right], \quad (10)$$

where $\zeta_{max}$ is the maximum PP density that can be sustained at the interface (i.e., all states are occupied).

According to Eq. (10), the maximum possible open circuit voltage, $V_{oc}^{max}$, is equal to the interfacial energy gap, less the polaron pair binding energy. This situation, arrived at empirically by Rand, et al. Phys. Rev. B 75, 115327 (2007), is reached in the limit T→0 or when $J_X$ increases to $J_X = a_0 k_{PPr} N_{HOMO} N_{LUMO}/\zeta_{max}$. Since $\zeta_{max} \sim N_{HOMO} \sim N_{LUMO}$ are all on the order of the molecular density, this final condition becomes $J_X = a_0 k_{PPr} N_{HOMO}$, which states that the exciton current is delivering the maximum density of charge that recombination at the interface can sustain. It is not possible to increase $J_X$ beyond this limit since, with all states filled, the net radiative transition rate approaches zero and the device becomes transparent. Accordingly, Eq. (10) may be viewed as an organic analog to the band-gap limitation of $V_{oc}^{max}$ in inorganic solar cells established by Shockley and Queisser, J. Appl. Phys. 32, 510 (1961).

TABLE 1

| Variable | Definition | Units |
|---|---|---|
| | Definition of variables | |
| | Trap-free | |
| $J_X$ | exciton current density reaching the HJ | $cm^{-2} s^{-1}$ |
| $\zeta$ | polaron pair density at the HJ | $cm^{-3}$ |
| $a_0$ | polaron pair spatial extent | cm |

TABLE 1-continued

Definition of variables

| Variable | Definition | Units |
|---|---|---|
| $k_{rec}$ | free carrier bimolecular recombination coefficient | cm$^3$ s$^{-1}$ |
| $k_{PPd}$ | polaron pair dissociation rate | s$^{-1}$ |
| $k_{PPr}$ | polaron pair recombination rate | s$^{-1}$ |
| $\theta_{PPd}$ | polaron pair dissociation efficiency | — |
| $\delta_A, \delta_D$ | fractions of the potential dropped across acceptor and donor layers | — |
| $n_I, p_I$ | free electron and hole densities at the HJ interface | cm$^{-3}$ |
| $n_C, p_C$ | free electron and hole densities adjacent to respective contacts | cm$^{-3}$ |
| $N_{HOMO}, N_{LUMO}$ | donor HOMO and acceptor LUMO edge densities of states | cm$^{-3}$ |
| Exponential Trap Distribution | | |
| $n_{It}, p_{It}$ | trapped free electron and hole densities at the HJ interface | cm$^{-3}$ |
| $T_{t,D}, T_{t,A}$ | characteristic temperatures for hole and electron trap distributions in the donor and acceptor | K |
| $H_D, H_A$ | band edge trap densities in the donor and acceptor | cm$^{-3}$ |
| $k_{rec,n}, k_{rec,p}$ | recombination coefficients for recombination of free electrons with trapped holes and vice versa | cm$^3$ s$^{-1}$ |
| $n_D, n_A$ | ideality factors due to trap limited recombination in the donor and acceptor | — |

Calculation of the Interfacial Electric Field

The interfacial electric field is required to calculate the polaron pair dissociation efficiency, $\eta_{PPd}$, in Eqs (7) and (15). Assuming that free carriers determine the potential distributions in their respective layers (e.g., holes (p) in the donor, and electrons (n) in the acceptor), then in quasi-equilibrium, $p\mu F \approx Dp'(x)$, and the Poisson equation gives $FF' - (D/\mu)F'' = 0$. Here, D is the diffusion coefficient, $\mu$ is the mobility of the charge under consideration, and F is the electric field. Assuming the Einstein relation between D and $\mu$, and defining $\beta = q/k_b T$, these equations may be solved as in D. Gupta, et al., Appl. Phys. Lett. 92, 093301 (2008) or they may be integrated once and solved as a Riccati equation (C. M. Bender and S. A. Orszag, *Advanced Mathematical Methods for Scientists and Engineers* (McGraw-Hill, New York, 1978)). Defining the constant $C_I = F_I^2 - 2qp_I/(\beta\varepsilon)$, the following results:

$$F(x) = \left[\frac{1}{F_I} - \frac{\beta x}{2}\right]^{-1} \quad (A1a)$$

$$p(x) = \frac{\beta\varepsilon}{2q}\left[\frac{1}{F_I} - \frac{\beta x}{2}\right]^{-2} \quad (A1b)$$

when $C_1 = 0$ and:

$$F(x) = \sqrt{C_1}\left[1 + \frac{2(F_I - \sqrt{C_1})}{(F_I + \sqrt{C_1})\exp(-\sqrt{C_1}\beta x) - (F_I - \sqrt{C_1})}\right] \quad (A2a)$$

$$p(x) = \frac{2\beta\varepsilon}{q}C_1\exp(\sqrt{C_1}\beta x)\frac{(F_I - \sqrt{C_1})(F_I + \sqrt{C_1})}{\left[(F_I + \sqrt{C_1}) - (F_I - \sqrt{C_1})\exp(\sqrt{C_1}\beta x)\right]^2} \quad (A2b)$$

when $C_1 \neq 0$, for both positive and negative values of $C_1$. As described herein, $F_I$ and $p_I$ are the electric field and hole density at the donor-acceptor interface located at position $x=0$. Since both the hole density at the interface and at the contact ($x=x_c$) are known from Eqs. (4) and (6), Eq. (A2b) can be solved implicitly for $F_I$.

For the case of an exponential trap distribution, assuming $p_t \gg p$, trapped carriers dominate the field distribution, and the Poisson equation is $F' \approx qp_t/\varepsilon$. Since quasi-equilibrium maintains for free carriers, the analog of Eq. (11) for holes is used to obtain $FF' - (DI_D/\mu)F'' = 0$. Thus, Eqs. (A1) and (A2) remain valid upon substituting $\beta \rightarrow \beta/I_D$, where Eq. (A2b) now refers to the trapped hole density. Using Eq. (11) to relate the trapped ($p_{c,t}$) and free ($p_c$) hole densities at the anode, with the latter given by Eq. (6), $p_{It} = p_{c,t} \exp[-q\delta_D (V_a - V_{bi})/I_D k_b T]$ and Eq. (A2b) is used again to solve for $F_I$.

After determining $F_I$, the polaron pair dissociation efficiency is calculated using the Onsager-Braun model, summarized here. Given an initial PP separation, $a_0$, the dissociation rate $k_{PPd}$ is:

$$k_{PPd} = \frac{3}{4\pi a_0^3}k_{rec}\exp(-E_B/k_b T)\frac{J_1[2\sqrt{-2b}]}{\sqrt{-2b}}, \quad (A3)$$

where $b = q^3 F_I/(8\pi\varepsilon k_b^2 T^2)$ and $J_1$ is the Bessel function of order one. To account for disorder, a range of initial separations was taken according to the normalized distribution function $f(x) = 4/(\sqrt{\pi}a_0^3)x^2 \exp(-x^2/a_0^2)$ and integrate it over the entire current density expression, since $k_{PPd}$ appears independently in addition to $\eta_{PPd}$.

The validity of Eq. (A3) for negative fields (i.e., when $F_I$ reverses direction under sufficient forward bias) is unclear, and its numerical evaluation becomes unstable for $F_I < 10^4$ V/cm. Analogy to the Onsager theory (M. Pope and C. E. Swenberg, *Electronic Processes in Organic Crystals and Polymers* (Oxford University Press, New York, 1999)), suggests that $k_{PPd}$ retains its zero field value at $F_I < 0$, however, this discontinuity seems unphysical, and Monte-Carlo simulations show that the dissociation efficiency at a D-A heterojunction does indeed decrease for fields directed toward the HJ. Thus, when $F_I < 0$, the zero field $k_{PPd}$ is taken and the PP binding energy is augmented with the additional barrier $-qf_I r_c \cos\theta$, where $r_c = q^2/(4\pi\varepsilon k_b T)$ is the Onsager radius. Averaging over the forward half-space of angles $-\pi/2 < \theta < \pi/2$ between the PP separation vector and the HJ normal accounts for the distribution of initial PP orientations.

Most organic solar cells are characterized by significant molecular disorder in both the donor and acceptor layers, leading to a broad density of states with an approximately Gaussian energetic distribution at the HOMO and LUMO levels. Evidence also suggests that ground state interactions between the donor and acceptor further broaden this distribution near the HJ interface. The low energy tail of the DOS, where most charge carriers reside, can be modeled as an exponential distribution of traps. This changes the kinetics of recombination at the interface, and introduces an ideality factor n>1 in the diode equation, as shown below.

Assuming an exponential trap distribution with characteristic trap temperature, $T_{t,A}$, in the acceptor, the trapped ($n_t$) and free (n) electron densities are related approximately via:

$$n_t \approx H_A \exp\left(\frac{E_{Fn} - E_{LUMO}}{k_b T_{t,A}}\right) \approx H_A\left(\frac{n}{N_{LUMO}}\right)^{1/t_A}, \quad (11)$$

where $H_A$ is the density of trap states at the acceptor LUMO, $E_{Fn}$ is its electron quasi-Fermi energy, $E_{LUMO}$ is the LUMO energy of the acceptor, and $l_A = T_{t,A}/T$. A similar relationship holds for the trapped hole density, $p_t$, in the donor. Assuming that the trapped carrier density significantly exceeds the free carrier density, Eq. (3) becomes:

$$J = qa_0\left(\frac{k_{PPr}}{k_{PPd}+k_{PPr}}\right)\left\{k_{rec,n}\left(n_1 p_{lt} - \frac{k_{PPd}}{k_{PPd,eq}}n_{1,eq}p_{lt,eq}\right) + k_{rec,p}\left(p_1 n_{lt} - \frac{k_{PPd}}{k_{PPd,eq}}p_{1,eq}n_{lt,eq}\right)\right\} - qJ_X\left(\frac{k_{PPd}}{k_{PPd}+k_{PPr}}\right), \quad (12)$$

where recombination now occurs primarily at trap states, and $k_{rec,n}$ and $k_{rec,p}$ are the rate constants describing recombination at the HJ between a free electron in the acceptor ($n_1$) with a trapped hole in the donor ($p_{lt}$), and vice versa.

Using Eqs. (4), (11) and (12) gives:

$$J = qa_0(1-\eta_{PPd}) \quad (13a)$$
$$\left\{k_{rec,n}N_{LUMO}H_D\exp(-\alpha_D/k_b T)\left[\exp(qV_a/n_D k_b T) - \frac{k_{PPd}}{k_{PPd,eq}}\right] + \ldots k_{rec,p}N_{HOMO}H_A\exp(-\alpha_A/k_b T)\left[\exp(qV_a/n_A k_b T) - \frac{k_{PPd}}{k_{PPd,eq}}\right]\right\} - q\eta_{PPd}J_X,$$

where $$\alpha_D = \frac{\Delta E_{HL}}{n_D} + \frac{l_D - 1}{l_D}(\delta_D \phi_c - \delta_A \phi_a), \quad (13b)$$

and $$\alpha_A = \frac{\Delta E_{HL}}{n_A} + \frac{l_A - 1}{l_A}(\delta_A \phi_a - \delta_D \phi_c). \quad (13c)$$

The ideality factors, $n_A$ and $n_D$ are given by:

$$n_A = \frac{l_A}{\delta_D(l_A - 1) + 1}, \quad (14a)$$

and $$n_D = \frac{l_D}{\delta_A(l_D - 1) + 1}. \quad (14b)$$

More compactly, Eq. 13 becomes the ideal diode equation in the presence of traps:

$$J = J_{sD}\left[\exp(qV_a/n_D k_b T) - \frac{k_{PPd}}{k_{PPd,eq}}\right] + J_{sA}\left[\exp(qV_a/n_A k_b T) - \frac{k_{PPd}}{k_{PPd,eq}}\right] - q\eta_{PPd}J_X. \quad (15a)$$

which simplifies to:

$$J = J_{sD}[\exp(qV_a/n_D k_b T) - 1] + J_{sA}[\exp(qV_a/n_A k_b T) - 1] - q\eta_{PPd}J_X, \quad (15b)$$

when $k_{PPd} \leq k_{PPd,eq}$ under forward bias (c.f. Eq. 8). Here $J_{sD}$ and $J_{sA}$ are the dark saturation currents given by the prefactors in Eq. (13).

Thus, in general, there are two sources of dark current stemming from the recombination of free electrons with trapped holes and vice versa. Each pathway produces its own ideality factor ($n_D$ and $n_A$, respectively) and dark saturation current, both of which depend on the balance of the voltage drop across the D and A layers as well as their characteristic trap temperatures.

In the case of a perfectly symmetric device, with identical transport properties and injection barriers for electrons and holes, Eq. (13) simplifies to:

$$J = qa_0(1-\eta_{PPd})2k_{rec,sym}N_{sym}H_{sym}\exp(-\Delta E_{HL}/n_{sym}k_b T) \quad (16a)$$
$$\left\{\exp(qV_a/n_{sym}k_b T) - \frac{k_{PPd}}{k_{PPd,eq}}\right\} - q\eta_{PPd}J_X,$$

or $$J = J_{sym}\{\exp(qV_a/n_{sym}k_b T) - 1\} - q\eta_{PPd}J_X, \quad (16b)$$

where $n_{sym} = 2l_{sym}/(l_{sym}+1)$ and the subscript sym indicates parameters that are equivalent for holes in the donor and electrons in the acceptor. Solving for $V_{oc}$ leads to:

$$qV_{oc} = \Delta E_{HL} - n_{sym}k_b T\ln\left[\left(\frac{k_{PPr}}{k_{PPd}}\right)\frac{k_{rec,sym}N_{sym}^2}{J_X/a_0}\right], \quad (17)$$

resulting in a slope of $n_{sym}k_b T/q$ when plotted versus the logarithm of intensity. The maximum open circuit voltage, $V_{oc}^{max}$, still reduces to $\Delta E_{HL} - E_B$, since in the limit of high light intensity, the original assumption of $n_t$, $p_t \gg n$, p no longer holds. In this regime all traps are filled and recombination is no longer trap-limited, hence, Eq. (17) reverts to Eq. (9).

FIG. 2a shows a set of dark J-V characteristics calculated using Eq. (13) over the temperature range from 120 K to 296 K for a device using the parameters listed in Table 2, which are typical of organic photovoltaic cells. Included is a series resistance of $R_s = 1 \Omega cm^2$ (in which case, $V_a$ is replaced by $V_a - JR_s$) and assumed that most of the potential is dropped across the donor layer, resulting in different ideality factors according to Eq. (14). The ideality factors and their associated dark saturation currents are given in FIG. 2b. Both ideality factors increase with decreasing temperature, and n ln($J_s$) is nonlinear when plotted vs. $1/k_b T$. This contrasts with previous analyses based on the Shockley equation, which predict a linear relationship for this quantity with a slope equal to $-\Delta E_{HL}/2$.

TABLE 2

| Model Parameter Values | |
| --- | --- |
| Parameter | Value |
| donor thickness = acceptor thickness | 40 nm |
| $\Delta E_{HL}$ | 1.2 eV |
| $V_{bi}$ | 0.5 V |
| $T_{t,A} = T_{t,D}$ | 1000 K |
| $H_A = H_D$ | $10^{18}$ cm$^{-3}$ |
| $N_{HOMO} = N_{LUMO}$ | $10^{21}$ cm$^{-3}$ |
| $\delta_A$ | 0.1 |
| $a_0$ | 1.5 nm |
| $k_{PPr}$ | 1 μs$^{-1}$ |
| $k_{rec,n} = k_{rec,p} = q\mu/\varepsilon$ | $\varepsilon/\varepsilon_0 = 3$, $\mu = 10^{-3}$ cm$^2$/Vs |
| $R_s$ | 1 Ω cm$^2$ |

In comparison to the dark current characteristics of many reported planar HJ organic solar cells, the following observation were made. In the generalized Shockley Equation, increasing dark current with reverse bias is phenomenologically accounted for by a shunt resistance, whereas here it is due to the field dependent dissociation of thermally generated PPs [i.e. $k_{PPd}=k_{PPd}(F_I)$]. The two slopes routinely observed in semi-log plots under forward bias (the second is only evident at low temperature for some devices) are not the result of a shunt resistance and a single diode ideality factor, but rather of two ideality factors that reflect recombination with trapped carriers at each side of the HJ.

In forward bias, the ideality factor $n_D$ is evident in the slope of the J-V characteristics for $0<V_a<0.3$ V, whereas $n_A$ dominates at $0.4<V_a<0.7$ V, beyond which series resistance from contacts and the layer bulk limits the current. The asymmetry of the voltage dropped across the donor and acceptor layers ($\delta_A=0.1$ is assumed here) is the primary cause of the difference in ideality factors, and is expected by analogy to the asymmetries in organic light emitting devices.

At low bias, the current is predominantly mediated by PPs formed from the recombination of free holes in the donor with trapped electrons in the acceptor. At higher bias ($0.4<V_a<0.7$), the reverse process dominates, and the slope is determined by $n_A$. As temperature decreases, carriers freeze into the trap states that constitute the tail of the DOS, and recombination becomes further trap-limited, resulting in the increase of both ideality factors with temperature (see FIG. 2b, Eq. 14).

Figure 2:
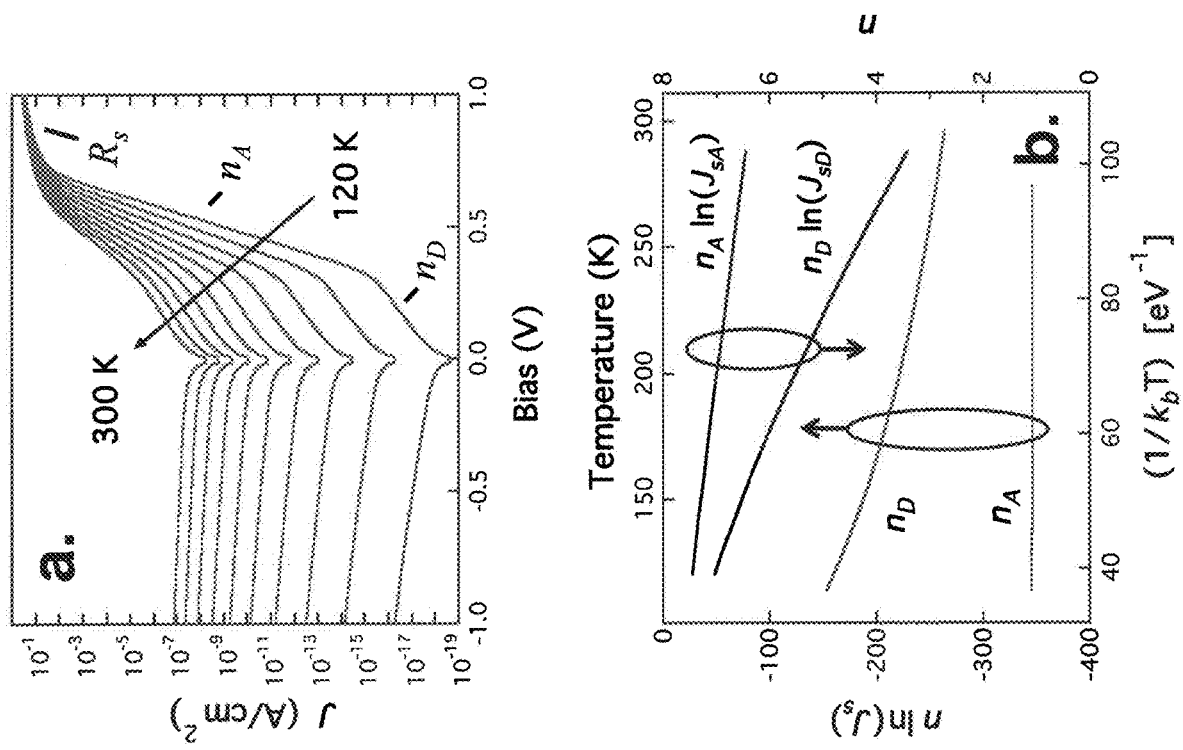
FIG. 2. (a) Shows the calculated dark current density (J)-voltage characteristics over the temperature range from 120K to 300 K in 20 K increments using Eq. (13) and the parameters in Table 2. The slope in reverse bias is due to the field dependent dissociation of thermally generated polaron pairs. In forward bias, three regions are apparent. At $V_a<0.3$ V, trap-limited recombination involving free acceptor electrons and trapped donor holes dominates, and the slope is proportional to the donor ideality factor, $n_D$. At higher bias, the inverse process dominates (i.e. free donor holes recombine with trapped acceptor electrons) and the slope is proportional to the acceptor ideality factor, $n_A$. Series resistance ($R_s$) limits the current at $V_a>0.8$ V. (b) Represents the diode parameters n and n $\ln(J_s)$ corresponding to the dark currents in (a). Both ideality factors increase with decreasing temperature.

In FIG. 3a, a calculation for the intensity dependence of $V_{oc}$, $J_{sc}$, and the fill factor, FF, from Eq. (13), using the same parameters from the dark J-V characteristics of FIG. 2 is provided. The exciton current density, $qJ_X$, is directly proportional to light intensity and is approximately equal to $J_{sc}$. The FF increases and then saturates at high light intensity. The open-circuit voltage increases as the log of intensity, with the slopes $n_D k_b T/q$ and $n_A k_b T/q$ at low and high intensity, respectively, as expected from the double exponential form of Eq. (13).

Figure 3:
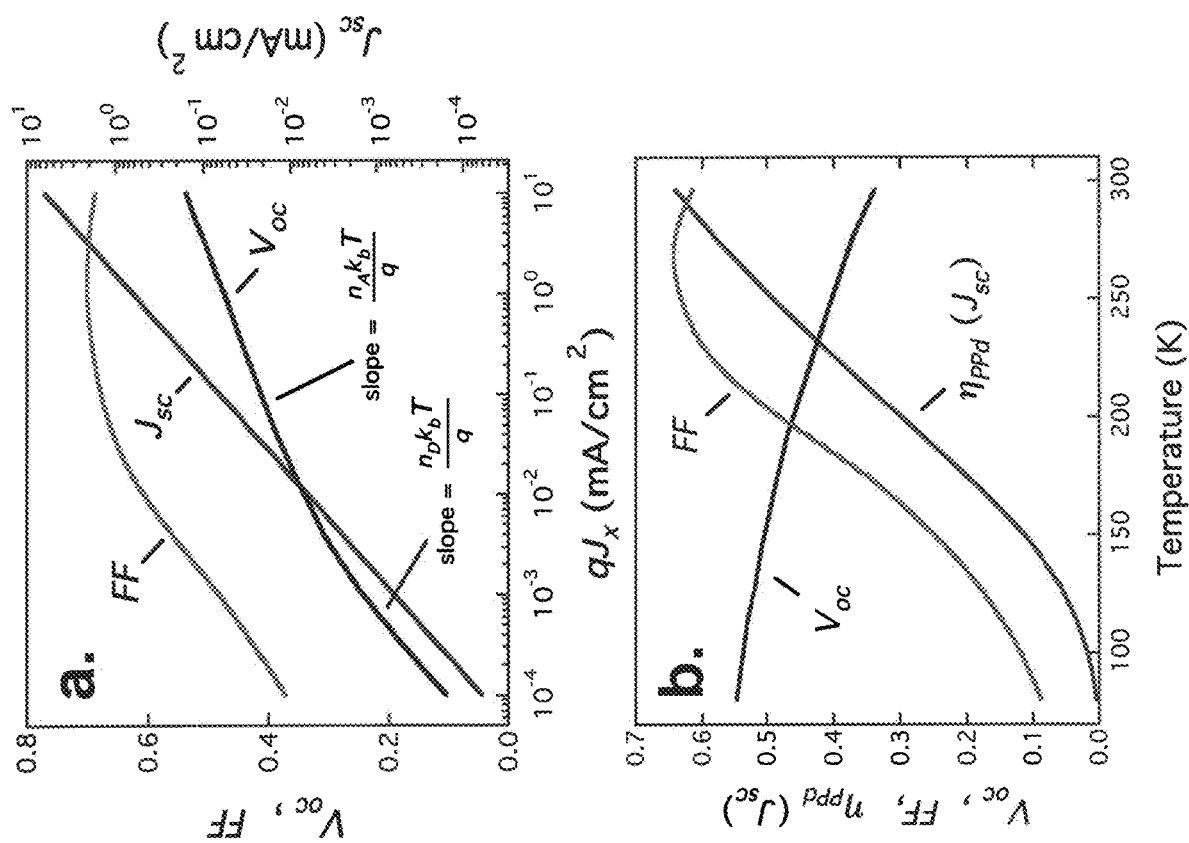
FIG. 3. (a) Shows the intensity dependence of the open-circuit voltage ($V_{oc}$), short-circuit current ($J_{sc}$) and fill factor (FF) derived from the same model and parameters as in FIG. 2. (b). Temperature dependence of $V_{oc}$, FF, and polaron pair dissociation efficiency at short circuit, $\eta_{PPd}(J_{sc})$.

FIG. 3b shows the temperature dependence of $V_{oc}$, FF, and the polaron pair dissociation efficiency at short circuit, $\eta_{PPd}$. The open-circuit voltage increases by ~0.25 V at low temperature, as compared to its value at T=300K, whereas FF steadily declines for T≤200 K. The polaron pair dissociation efficiency decreases substantially with decreasing T from its room temperature value of $\eta_{PPd}$~0.6. The theoretical trends in FIG. 3 have been observed in both small molecular and polymer organic solar cells.

The trap-free and trap-limited ideal diode equations derived here (Eqs. 7 and 15, respectively) are similar in form to the Shockley Equation but the interpretation of the fitting parameters (ideality factors, saturation current densities) is different due to the different nature of excited states in organic and inorganic semiconductors. In inorganic semiconductors, excitation produces free carriers directly, whereas in organic semiconductors, the result of photon absorption is a tightly bound exciton that has a very low probability of dissociating unless charge transfer is initiated at a D-A HJ to form a more loosely bound polaron pair. Thus, in contrast to inorganic p-n junctions where current is due to drift-diffusion and/or recombination within the depletion region, the current in organic HJs depends on polaron pair recombination and dissociation that occur over a small volume at the HJ interface.

In the absence of shunt paths or other junction defects, generation and recombination via interfacial polaron pairs is the sole source of current flow. This assumption is reasonable at low bias since PPs provide the lowest energy recombination pathway in D-A HJs with Type II (i.e., staggered) HJ energy level offsets, and hence should be the most heavily populated state at small quasi-Fermi level separations. As described in more detail below, this is not the case at high bias ($V_a>2$ V), where both SubPc and $C_{60}$ fluorescence are detected, indicating injection beyond the HJ (i.e. of holes into the acceptor bulk, and electrons into the donor), with subsequent exciton formation and recombination in each of the layers. This assumption thus does not apply to organic light emitting devices, which generally operate at high bias ($V_a>2$ V) and are designed to minimize energy level offsets to maximize injection into, and exciton formation in the emissive layer bulk.

As in the Shockley Equation, quasi-equilibrium conditions are assumed, implying that J is negligible compared to either of its drift or diffusion components. This assumption is rigorous at low currents, but breaks down for J>0.1 A/cm, where the voltage drop due to contact and bulk series resistance becomes significant. Beyond these assumptions, the trap-free current-voltage relationship and its consequences for $V_{OC}$ established by Eqs. (9) and (10) are of general validity.

Disorder-induced and other trap states complicate the trap-free picture, as the recombination kinetics depend on the particular trap distribution chosen. Regardless of this choice, the double exponential form of the J-V relation given by Eq. (15) is a general result, as it stems from the two possible recombination pathways of free electrons with trapped holes, and vice versa.

Shockley-Hall-Read (SHR) theory provides an alternate way to describe trap-limited recombination. Although this approach has previously been applied to organic solar cells, it assumes detailed balance of traps active for both carrier types in a single material. In contrast, the organic HJ involves two different sets of traps, active for holes and electrons in the donor and acceptor layers, respectively. The Langevin bimolecular approach of Eq. (12) is well established for organic semiconductors, and its application here is more appropriate than the SHR approach.

Figure 4:
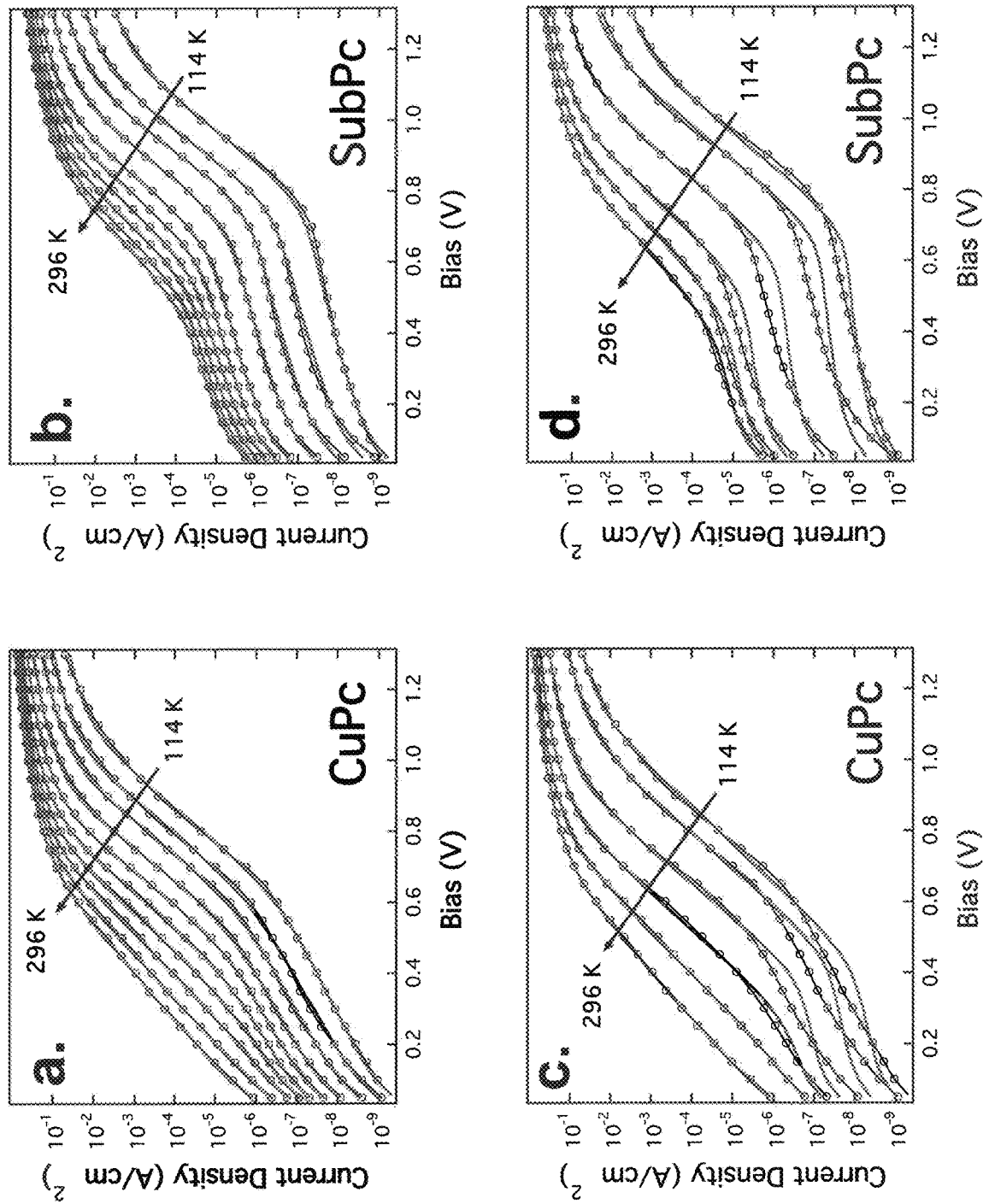
FIG. 4. Shows the dark current density vs. forward voltage for (a) CuPc/$C_{60}$ and (b) SubPc/$C_{60}$ devices recorded for T=296, 275, 247, 218, 193, 171, 155, 145, 128, and 114 K. Bold (red) lines indicate fits to Eq. (18) in the description. Thin (black) lines connect the data points and serve as a guide to the eye. Both data sets are refit using the generalized Shockley Equation in (c) and (d), where the difference between data and theory is most pronounced at low voltage and temperature. Several intermediate temperatures have been omitted in (c) and (d) for clarity.
Figure 5:
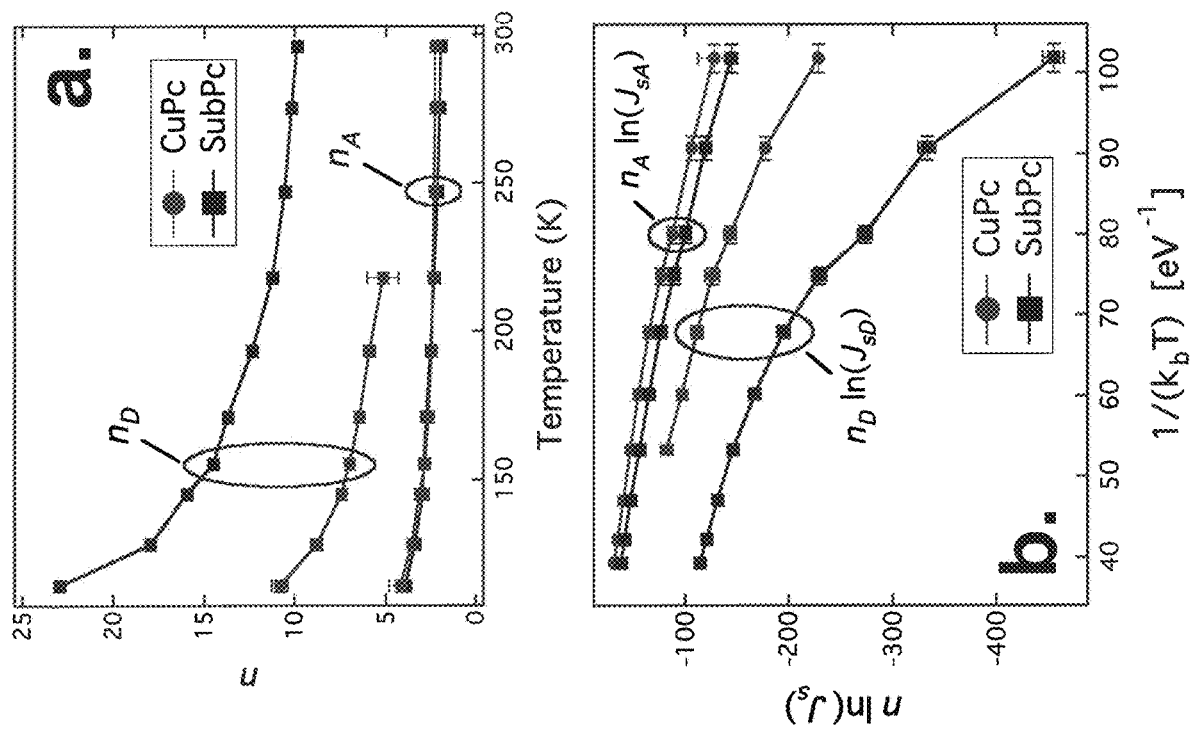
FIG. 5. (a) Represents temperature dependence of the ideality factors derived from the J-V data of FIG. 4. The ideality factors increase with decreasing temperature in all cases. Values of $n_D$ and $J_{sD}$) cannot be extracted for CuPc/$C_{60}$ at T>220 K because the second exponential term in Eq. (18) is insignificant. (b) Shows a plot of n $\ln(J_s)$ vs $1/k_bT$, where $k_bT$ is the thermal energy, for the CuPc/$C_{60}$ and SubPc/$C_{60}$ devices. Note the similarity in $n_A$ and $n_A \ln(J_{sA})$ between the two cells, which share a common $C_{60}$ acceptor, whereas $n_D$ and $n_D \ln(J_{sD})$ clearly differ due to the different donors.

The fits of FIG. 4 demonstrate that Eq. (18) is an accurate description of the J-V characteristics, as compared to the generalized Shockley Equation for CuPc/$C_{60}$ and SubPc/$C_{60}$ solar cells. In FIG. 5, the similarity in $n_A$ and $n_A \ln(J_{SA})$ between CuPc/$C_{60}$ and SubPc/$C_{60}$ suggests that the current component involving these terms is due to recombination with trapped electrons in the $C_{60}$ acceptor common to both HJs. Analogously, the differing $n_D$ and $n_D \ln(J_{sD})$ suggests recombination with trapped holes occupying the different density of states characteristic of CuPc and SubPc.

Figure 6:
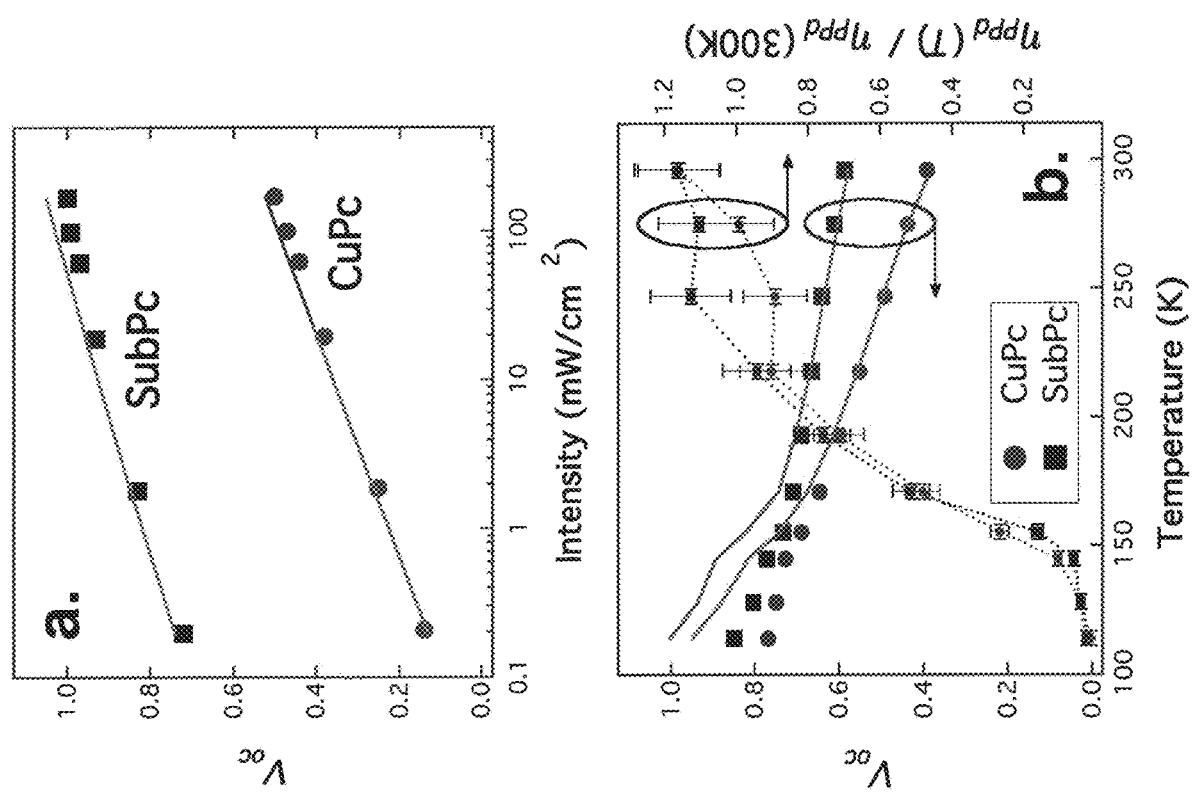
FIG. 6. (a) Represents the dependence of the open circuit voltage, $V_{oc}$, on the intensity of simulated AM1.5 G solar illumination at room temperature. Solid lines are calculated from Eq. (18) using values of n and $J_s$ from FIG. 5 along with the short-circuit current densities measured at each intensity. (b) Shows the temperature dependence of $V_{oc}$ under laser illumination at λ=496 nm, and at an intensity of 30 mW/cm². Solid lines are calculated using the temperature dependent n and $J_s$ of FIG. 5 and the short-circuit current density measured at room temperature. Deviation between the calculation and the data at low temperature indicates a reduced polaron pair dissociation efficiency, $\eta_{PPd}(T)$, shown on the right hand axis, and normalized to its value at room temperature. Dashed lines connecting the data points are a guide to the eye.

The values of n and $J_s$ from FIG. 5 give rise to the intensity and temperature dependencies of $V_{oc}$ in FIG. 6. Only one slope is evident in FIG. 6a for each device. A second slope is expected, as predicted in FIG. 3a to become apparent at low intensity or low temperature. In FIG. 6b, the deviation in calculated $V_{oc}$ from the data at low temperature is due to the drop in polaron pair dissociation efficiency, as expected from the Onsager-Braun model and replicated in FIG. 3b.

While the trends predicted in FIG. 2b are qualitatively similar to those in FIG. 5, their primary difference is the magnitude and degree of change predicted for the ideality factors. This is partially attributed to the choice of an exponential trap distribution, which, although useful in enabling analytical results, may not accurately represent the trap distributions in the materials provided here. Furthermore, $\delta_D$ and $\delta_A$ do not cancel as in the trap-free case and hence changes in the potential distribution across the D and A layers with bias and/or temperature will also influence the ideality factors [see Eq. (14)].

A further concern is the implicit use of the conventional Einstein relation for the charge carrier mobility, which may not be appropriate for disordered semiconductors. The Einstein relation depends on the particular density of states or trap distribution function and in general increases (i.e., $D/\mu > k_b T/q$, where D is the diffusivity) with carrier density and with decreasing temperature. As the ideality factors depend directly on this change, its incorporation into the model results in an increase in the magnitude of $n_A$ and $n_D$ and leads to a stronger temperature dependence, as observed in the data. Despite this shortcoming, as shown in FIG. 3, the model qualitatively predicts the magnitudes, and intensity and temperature dependences of $V_{oc}$, $J_{sc}$, and FF that are commonly observed in organic HJ solar cells using the typical material parameters listed in Table 2.

Previously, $V_{oc}$ was observed to saturate at T~175 K for a number of different HJs (V. Dyakonov, Appl. Phys. A 79, 21 (2004) and B. P. Rand, D. P. Burk, and S. R. Forrest, Phys. Rev. B 75, 115327 (2007)), whereas other reports (H. Kumar, P. Kumar, N. Chaudhary, R. Bhardwaj, S. Chand, S. C. Jain, and V. Kumar, J. Phys. D 42 (2009)), and the data in FIG. 6b show a monotonic increase with decreasing temperature. The reason for this discrepancy may lie in the difficulty of accurately measuring device temperature under illumination on a thermally insulating glass substrate. A plateau in $V_{oc}$ at intermediate temperature is not predicted in FIG. 3b using the parameters in Table 2. However, in some asymmetric HJs with different D and A layer thicknesses, trap temperatures, and injection barriers (i.e. $\phi_a$ and $\phi_c$), a plateau is found to emerge between T=100 K and 150 K, as observed.

Figure 7:
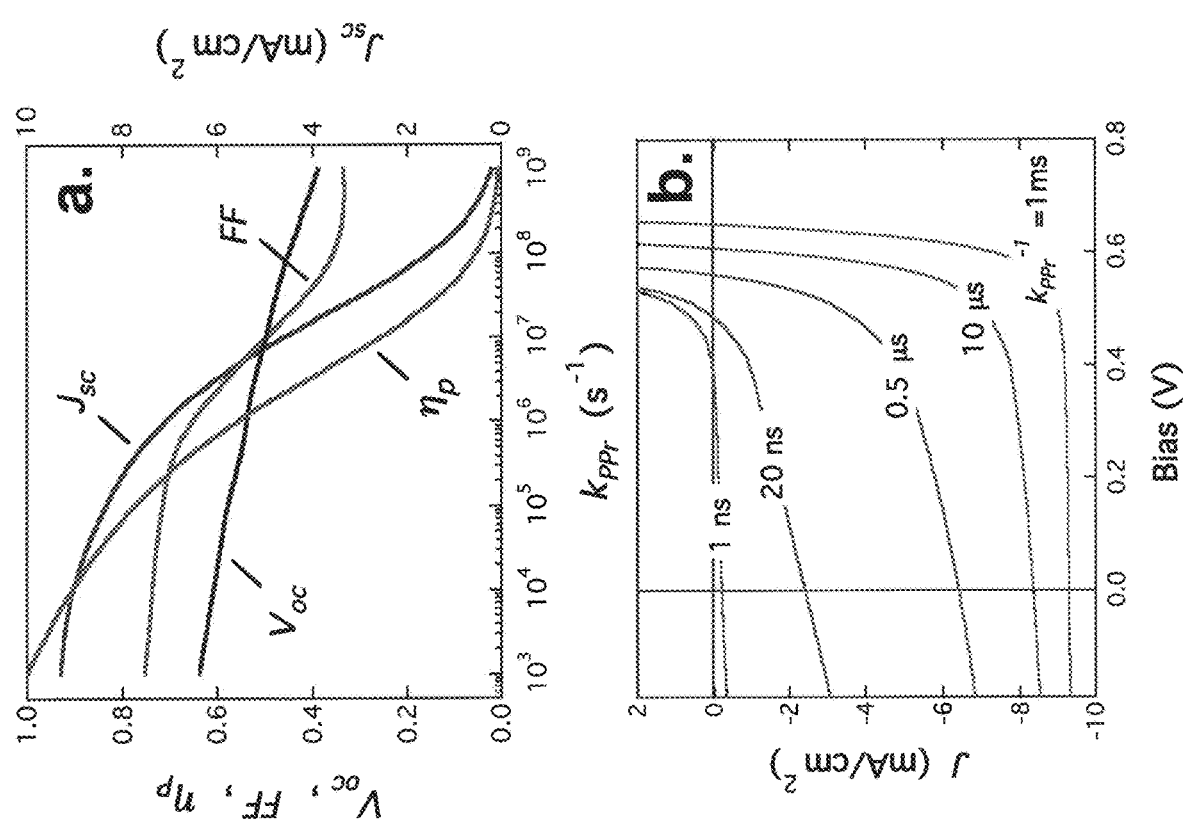
FIG. 7. (a) Represents the dependence of open circuit voltage, fill factor and short circuit current ($V_{oc}$, FF, $J_{sc}$, respectively), and normalized power conversion efficiency, $\eta_P$, on the polaron pair recombination rate, $k_{PPr}$. An exciton current of $qJ_X$=10 mA/cm² is assumed. (b) Shows the Fourth quadrant J-V characteristics at several values of $k_{PPr}$ resulting in the trends shown in (a).

As shown in FIG. 7, the solar power conversion efficiency depends critically on the polaron pair recombination rate, $k_{PPr}$. The decline in $J_{sc}$ is due to the decrease in PP dissociation efficiency with increasing $k_{PPr}$, and the drop in $V_{oc}$ follows Eq. (9). Physically, $k_{PPr}$ describes either the direct recombination of the $D^+-A^-$ charge transfer state, or its indirect recombination, e.g., via a lower-lying triplet state. Estimates for this parameter generally range between 1 ns$^{-1}$ and 1 μs$^{-1}$, as supported by polaron transient absorption kinetics, electronic modeling of D-A excited states, and Monte-Carlo simulations of geminate recombination.

Figure 8:
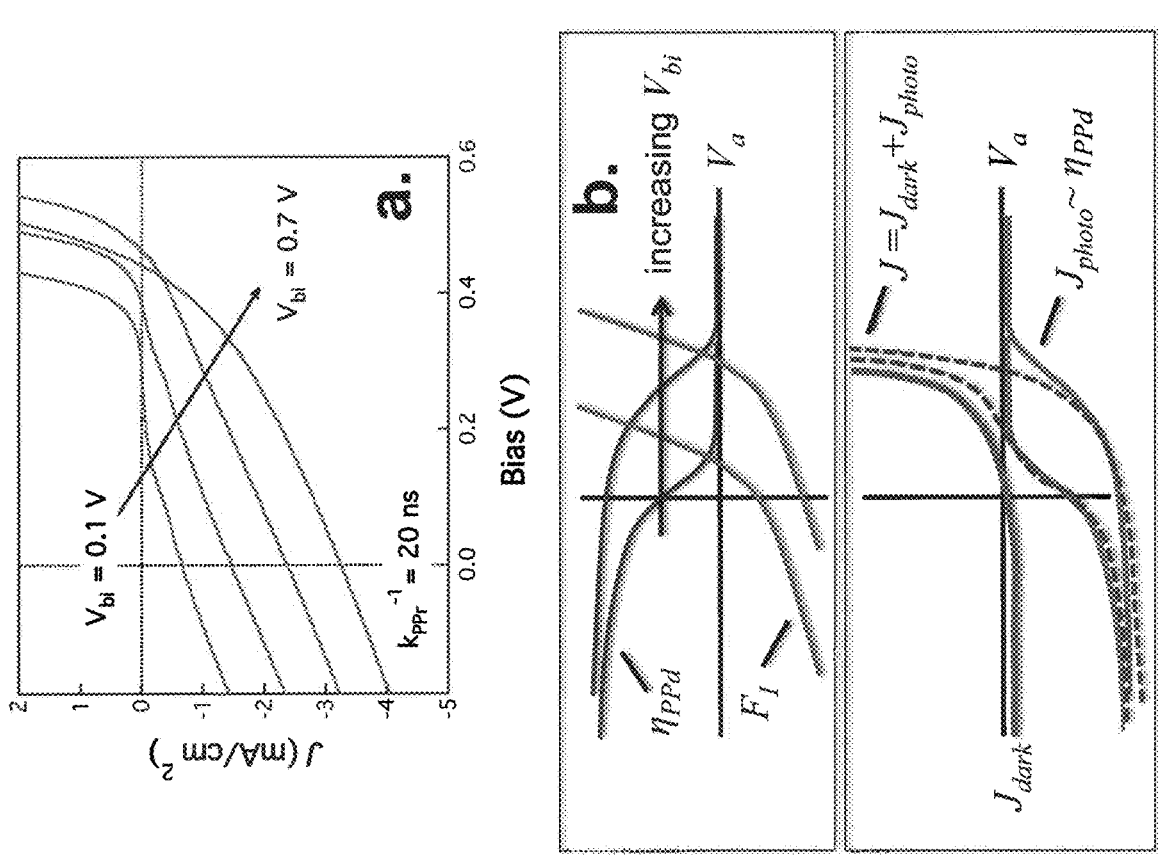
FIG. 8. (a) Shows the Current-Voltage characteristics calculated for $V_{bi}$ ranging from 0.1 to 0.7 V in 0.2 V increments using the same model as in FIG. 7b with $k_{PPr}$=(20 ns)$^{-1}$. (b) Is a schematic illustrating the physical basis for the 'S-kink' observed in (a). The top panel shows the dependence of the internal field, $F_I$, and polaron pair dissociation efficiency, $\eta_{PPd}$, on the applied bias, $V_a$. Dissociation is aided by $F_I<0$. The lower panel shows the corresponding photocurrents, which sum with the dark current to give the total current (dashed lines). When $V_{bi}$ is small, the internal field reaches zero at small $V_a$, resulting in a rapid change in photocurrent before the dark current becomes appreciable, leading to the 'S-kink' as shown.

Finally, the 'S-kink' behavior found many organic HJ cells in FIG. 8a is explained schematically in FIG. 8b. The top panel illustrates the shift in zero-crossing of the internal field ($F_1<0$ favors dissociation) toward positive applied bias with increasing $V_{bi}$. It leads to a similar shift in the PP dissociation efficiency, $\eta_{PPd}$, and hence to a concomitant shift in the photocurrent (c.f. Eq. 7).

The lower panel shows that the total current is the sum of the dark and photocurrents. The 'S-kink' appears when the slope of the photocurrent, as determined by $\eta_{PPd}$, is large in the fourth quadrant at low bias, and when the dark current is not yet significant. At room temperature, this typically occurs for a combination of large $k_{PPr}$ (e.g. $\geq 10^7$ s$^{-1}$) and small $V_{bi}$ (e.g. $\leq 0.3$ V). In contrast, at low temperature this feature emerges for a much broader range of $V_{bi}$ and $k_{PPr}$, since under these conditions, $k_{PPd}$ is small, shifting the $\theta_{PPd}$ curve (see top panel) toward low applied bias. An 'S-kink' is thus expected to be a general feature in the J-V characteristic of organic HJ solar cells under illumination at low temperature.

Understanding and minimizing the PP recombination rate is clearly important for achieving high efficiency organic solar cells. The $k_{PPr}$ employed in the Onsager-Braun model may in fact be the result of multiple recombination pathways, potentially involving intermediate states, and depending on such factors as mutual orientation and orbital overlap between the donor and acceptor molecules at the heterointerface. For example, Perez et. al. linked the degree of π-π overlap and intermolecular interaction between the donor and acceptor to the dark saturation current and $V_{oc}$ in a broad selection of molecules. Both of these factors depend directly on the magnitude of $k_{PPr}$. Additionally, rapid intersystem crossing between singlet and triplet PP configurations due to the small exchange splitting can make recombination via a triplet exciton favorable if such a state exists below the PP energy.

Based in part on this understanding, the present disclosure further describes the nature of $k_{PPr}$ at CuPc/$C_{60}$ and SubPc/$C_{60}$ HJs. For example, in one embodiment, the present disclosure relates to PP dynamics in two archetype planar HJ organic solar cells consisting of copper phthalocyanine (CuPc)/$C_{60}$ and boron subpthalocyanine chloride (SubPc)/$C_{60}$ donor-acceptor (D-A) pairs.

In one embodiment, the present disclosure provides for an organic photosensitive optoelectronic device comprising:
two electrodes comprising in superposed relation;
at least one donor material, and
at least one acceptor material,
the at least one donor material and at least one acceptor material forming at least one photoactive region between the two electrodes,
wherein the at least one donor material and at least one acceptor material are ordered in their bulk and comprise a disordered region at their interface.

In one embodiment, the disordered region comprises a non-crystalline region, a steric bulk region, or combinations thereof.

The disordered region may comprise disorder in the donor material, disorder in the acceptor material, or combinations thereof.

In one embodiment, the disordered region comprises less than ten monolayers of the donor material and/or the acceptor material.

In one embodiment, the photo-active region forms at least one of a mixed heterojunction, bulk heterojunction, nanocrystalline-bulk heterojunction, and hybrid planar-mixed heterojunction.

In one embodiment, the order in the bulk comprises at least one of single crystal, nanocrystalline or polycrystalline material.

Non-limiting examples of the donor that may be used herein include subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ).

Non-limiting examples of the acceptor that may be used herein include $C_{60}$, $C_{70}$, 3,4,9,10-perylenetetracarboxylicbis-benzimidazole (PTCBI), PCBM, PC70BM and hexadecafluorophthalocyanine (F16CuPc).

In one embodiment, the at least one electrode comprises transparent conducting oxides or transparent conducting polymers.

Non-limiting examples of conducting oxides that may be used herein include indium tin oxide (ITO), tin oxide (TO), gallium indium tin oxide (GITO), zinc oxide (ZO), and zinc indium tin oxide (ZITO), and the transparent conductive polymers comprise polyanaline (PANI).

In one embodiment, the at least one electrode comprises a metal substitute, a non-metallic material or a metallic material chosen from Ag, Au, Ti, Sn, and Al.

The organic photosensitive optoelectronic device as described herein may further include at least one exciton blocking layer.

Non-limiting examples of the exciton blocking layer that may be used herein include bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium (III) (Ru(acaca)$_3$), and aluminum(III) phenolate (Alq$_2$OPH).

In one embodiment, the organic photosensitive optoelectronic device is an organic photodetector. In another embodiment, the organic photosensitive optoelectronic device is an organic solar cell.

In one embodiment, the present disclosure also provide for a method of making an organic photosensitive optoelectronic device, the method comprising depositing onto a substrate,
at least one donor material,
at least one acceptor material, and
at least one electrode,
wherein the at least one donor material and at least one acceptor material are deposited to form at least one photoactive region between the two electrodes,
wherein the at least one donor material and at least one acceptor material are ordered in their bulk and comprise a disordered region at their interface.

In one embodiment, the disordered region is formed by forming a non-crystalline region, a steric bulk region, or combinations thereof. In another embodiment, the disordered region is formed by disordering the donor material, disordering in the acceptor material, or disordering both the donor and acceptor materials.

In one embodiment, the disordered, non-crystalline region comprises less than ten monolayers each of the donor material and the acceptor material.

The disordered, non-crystalline region described herein may be formed by changing the deposition conditions used to deposit the donor and acceptor materials. In another embodiment, the disordered, non-crystalline region is formed by modifying the molecules used as the donor and acceptor materials.

In one embodiment, the depositing occurs in a vacuum.

Weak emission from exciplex states at the D-A heterointerface, and intensity modulated photocurrent spectroscopy (IMPS) to monitor changes in the PP density as functions of bias and illumination intensity are also described.

$k_{PPr}$ depends on electric field for both material pairs, and that it is significantly larger in CuPc/C$_{60}$ than in SubPc/C$_{60}$. To understand these differences, an expression for $k_{PPr}$ was found, which qualitatively explains the exciplex luminescence and IMPS trends observed. Additionally, further observations support the rate-based description of polaron pair dynamics used to derive the organic HJ ideal diode equation described above.

Intensity modulated photocurrent spectroscopy (IMPS) is a useful tool to explore the balance between photocurrent and recombination current that has previously been applied to electrochemical and dye-sensitized solar cells. It involves superimposing a small optical modulation onto the steady-state excitation incident on a cell, and measuring both the magnitude and phase of the resulting photocurrent. This yields a complex external quantum efficiency, $\tilde{\Phi}$, that depends on the optical modulation frequency in addition to, for example, the steady-state light intensity and cell electrical bias.

The time-dependent polaron pair and interfacial free carrier densities are described via:

$$\frac{d\zeta}{dt} = \frac{j_X}{a_0} - k_{PPr}\zeta - k_{PPd}\zeta + k_{rec}n_1 p_1, \quad (19)$$

and $$\frac{dp_1}{dt} = k_{PPd}\zeta - k_{rec}n_1 p_1 - \frac{J}{qa_0}. \quad (20)$$

Here, $J_X$ is the exciton current density diffusing to the HJ which undergoes quantitative charge transfer and contributes to $\zeta$ the polaron pair density. The electronic charge is q, and $n_I$ and $p_I$ are the free electron and hole densities at the HJ interface, respectively. The heterojunction volume is defined by the average polaron pair separation, $a_0$, and $k_{rec}$ is the bimolecular Langevin recombination coefficient. Polaron pairs dissociate at rate $k_{PPd}$ given by the Onsager-Braun model, and recombine to the ground state at rate $k_{PPr}$, resulting in a dissociation efficiency $\eta_{PPd}=k_{PPd}/(k_{PPd}+k_{PPr})$. The intrinsic thermal equilibrium PP density, $\zeta_{eq}<<\zeta$ under IMPS illumination, and has therefore been omitted from Eq. (19). Additionally, J is redefined in Eq. (20) as positive in the direction of photocurrent, consistent with IMPS convention.

Due to the harmonic perturbation in IMPS illumination at frequency, $\omega$, the photogenerated exciton diffusive flux reaching the interface becomes $J_X \rightarrow J_X(1+\delta e^{i\omega\tau})$, which assumes that the exciton lifetime is small compared to $\omega^{-1}$. Similarly, the steady-state and time varying components of Eqs. (19) and (20) are separated as, for example, $J \rightarrow J+\tilde{j}e^{i\omega\tau}$ and $p_I \rightarrow p_I+\tilde{p}_I e^{i\omega\tau}$, where the tilde denotes a complex, small-signal quantity. Retaining only first order harmonic terms Eq. (20) gives:

$$i\omega\tilde{p}_1 = k_{PPd}\tilde{\zeta} - k_{rec}n_1\tilde{p}_1 - \frac{\tilde{j}}{qa_0}. \quad (21)$$

The layer bulk between the interface and the contact may be approximated by its equivalent, parallel resistance-capacitance (RC) circuit, where the impedance is $\tilde{Z}=R/(1+i\omega\tau)$ and $\tau=RC$. Hence, relating the areal charge density at the interface, $\tilde{Q}_I=qa_0\tilde{p}_I$, to the small-signal current density, $\tilde{j}$ via the usual capacitive relationship:

$$\tilde{Q}_1 = (C\tilde{Z}\tilde{j}). \quad (22)$$

Equations (19), (21) and (22) are solved for $\tilde{j}$ and normalized by $q\delta J_X$ to give the complex IMPS response:

$$\tilde{\Phi} = \frac{\eta_{PPd}(1+i\omega\tau)}{1+k_{rec}n_1\tau(1-\eta_{PPd})+2i\omega\tau}, \quad (23)$$

where the modulation frequency is assumed to be low compared to the polaron pair dynamics (i.e. $\omega<<k_{PPd}+k_{PPr}$). Equation (23) predicts a transition from Im($\tilde{\Phi}$)<0 to Im($\tilde{\Phi}$)>0 when $k_{rec}n_I\tau(1-\theta_{PPd})>1$. Hence, an increase in the interfacial free carrier density can cause a crossover from phase lag to phase advance in the IMPS spectrum.

The trap-free model detailed above was used to determine the steady-state quantities (e.g. $n_I$ and $\theta_{PPd}$) in Eq. (23), and assume a symmetric planar HJ for simplicity. Observations discussed below suggest that $k_{PPr}$ depends on the electric field at the interface, $F_I$. As a first approximation, a field-dependent shift ($qF_1r$) in the PP potential is added to existing energy barriers that determine the rate of recombination, viz.:

$$k_{PPr} = k_{PPr0} \exp\left(\frac{qF_1 r}{k_b T}\right). \quad (24)$$

Here, $k_{PPr0}$ is the zero-field recombination rate, r is the PP separation, and $F_I$ is the electric field at the interface, as calculated in Calculation of the Interfacial Electric Field above. As before, $k_{PPr}$ and $k_{PPd}$ over a Gaussian distribution of separations is evaluated, taking the average value $a_0=1.5$ nm. Equation (24) describes a physical situation analogous to field-induced energy barrier lowering such as the Schottky effect, or Frenkel-Poole emission in conventional semiconductors.

EXAMPLES

Example 1

Conventional CuPc/$C_{60}$ and SubPc/$C_{60}$ cells were fabricated on glass substrates coated with a transparent indium tin oxide (sheet resistance of ~15 ohms/square) anode pre-patterned into 1 mm wide stripes. All organic materials were purified by thermal gradient sublimation prior to use. Following a thorough solvent degrease of the substrate, layers were deposited sequentially by thermal evaporation in a chamber with base pressure ~$10^{-7}$ Torr. The devices consist of 20 nm thick CuPc or 11 nm thick SubPc, followed by 40 nm thick $C_{60}$, 10 nm thick bathocuprine, and a 100 nm thick Al cathode, deposited through a shadow mask as 1 mm stripes positioned orthogonally to the patterned anode to form 1 mm² device areas.

Cell efficiency was characterized at room temperature in air under simulated AM1.5G illumination, and found to be comparable to previously reported devices using these materials combinations K. L. Mutolo, E. I. Mayo, B. P. Rand, S. R. Forrest, and M. E. Thompson, J. Am. Chem. Soc. 128, 8108 (2006); and M. D. Perez, C. Borek, S. R. Forrest, and M. E. Thompson, J. Am. Chem. Soc. 131, 9281 (2009). Temperature dependent measurements were conducted in an evacuated, closed-cycle He cryostat using illumination from the 2=496 nm line of an $Ar^+$ laser with an intensity of 30 mW/cm². The temperature of each device was measured with a Ge thermistor soldered to the substrate surface. Current-voltage characteristics were obtained using an Agilent 4156 semiconductor parameter analyzer at a voltage sweep rate of 0.2 V/s to minimize unwanted capacitive effects. The current-voltage characteristics were fit using a nonlinear least squares trust-region algorithm with statistical weighting.

In FIGS. 4a and b, the J-V data taken over a range of temperatures are fit for both CuPc/$C_{60}$ and SubPc/$C_{60}$ cells to the ideal diode equation of Eq. (15) modified to include the effect of series resistance, $R_s$:

$$J = J_{sD}\{\exp[q(V_a - JR_s)/n_D k_b T] - 1\} + J_{sA}\{\exp[q(V_a - JR_s)/n_A k_b T] - 1\} - q\eta_{PPd}J_X. \quad (18)$$

The results of Eq. (18) matched the data over the entire temperature range, whereas those calculated using the generalized Shockley Equation and plotted in FIGS. 4c and d, show increasingly poor agreement at low temperature and voltage.

FIG. 5 presents the ideality factors and dark saturation currents extracted from the fits in FIGS. 4a and 4b. Both sets of ideality factors increase with decreasing temperature, similar to the prediction of FIG. 2b. $n_A$ was assigned to the overlapping ideality factors of CuPc/$C_{60}$ and SubPc/$C_{60}$ as above. In FIG. 5b, the quantity n ln($J_s$) showed a non-linear Arrhenius dependence in all cases, where the trend was also similar to that predicted in FIG. 2b.

FIG. 6a shows the intensity dependence of $V_{oc}$ under simulated AM1.5G solar illumination. Lines are calculated using Eq. (18) along with the ideality factors and dark saturation currents determined from data in FIG. 5. The photocurrent, $q\eta_{PPd}J_X$, is approximated by the short-circuit current density, $J_{sc}$, measured at each intensity. The slopes are dominated by $n_A k_b T/q$ for both CuPc/$C_{60}$ and SubPc/$C_{60}$ devices; that of $n_D k_b T/q$ only becomes evident at lower intensity.

The temperature dependence of $V_{oc}$ under $\lambda$=496 nm laser illumination is shown in FIG. 6b. The solid lines are also calculated from Eq. (18) using the temperature dependent n and $J_s$ from FIG. 5, with the photocurrent term given by $J_{sc}$ measured at T=300 K. Since the diode parameters characterize the dark current temperature dependence, inference provides that the deviation at low temperature is due to a decrease in the polaron pair dissociation efficiency, $\eta_{PPd}$. The ratio, $\eta_{PPd}(T)/\eta_{PPd}(300K)$, calculated from this difference, is also shown in FIG. 6b (dashed lines), and drops by a factor of ~40 between room temperature and T=114 K.

In FIG. 7a, the normalized power efficiency, $\eta_p$, is calculated along with $V_{oc}$, $J_{sc}$, and FF as a function of the polaron pair recombination rate using the model as in FIGS. 2 and 3. Current-voltage characteristics corresponding to several values of $k_{PPr}$ are shown in FIG. 7b. All of the cell efficiency parameters decrease with increasing recombination rate, and the power conversion efficiency drops most steeply for $k_{PPr}>1$ $\mu S^{-1}$. In contrast, FIG. 8a shows the J-V dependence on built-in potential, $V_{bi}$, for the same model as in FIG. 7b, with $k_{PPr}=(20$ ns$)^{-1}$. Small $V_{bi}$ result in an 'S' shaped kink as observed in some small molecule and polymer organic solar cells.

Example 2

Conventional CuPc/$C_{60}$ and SubPc/$C_{60}$ cells were fabricated and characterized using methods similar to those as described in Example 1. In brief, the cells consisted of a 20 nm thick CuPc or 11 nm thick SubPc layer vacuum-deposited at a chamber base pressure of $10^{-7}$ Torr on an indium tin oxide covered glass substrate, followed by a 40 nm thick layer of $C_{60}$, 10 nm thick bathocuprine (BCP), and a 100 nm thick Al cathode.

Room temperature IMPS was conducted in a sealed, electrically and optically accessible chamber continuously purged by dry $N_2$ to minimize device degradation. Low temperature data were obtained in a closed-cycle, evacuated He cryostat, and temperature was measured using a Ge thermistor soldered to the substrate surface. An $Ar^+$ laser ($\lambda_{ex}$=496) nm with an intensity of 30 mW/cm² was used for excitation; the trends observed were independent of excitation wavelength over the range from $\lambda_{ex}$=476 nm to 514 nm. A small fraction of the incident beam (<5%) was acousto-optically modulated at frequencies ranging from 1 Hz to 100 kHz, and the photocurrent was measured with a lock-in amplifier. Impedance spectra were used to measure the time constant, $\tau$, for each device. Although $\tau$ varies with bias and illumination intensity, it was found that $\tau$~5 $\mu$s is typical for both cells near $V_{oc}$ under the 30 mW/cm² IMPS illumination. This value was used for all simulations.

Luminescence was characterized from the same $N_2$ purged sample cell using the $\lambda_{ex}$=442 nm line of a HeCd laser for excitation. This wavelength coincides with a minimum in SubPc absorption to prevent its fluorescence from obscuring the weak exciplex emission. The excitation beam was split into a weak signal beam and a variable intensity bias beam. The transverse electric polarized signal beam was acousto-optically modulated at 2 mW/cm² rms intensity, and was incident on the sample at an angle of 60°. Steady-state bias illumination was incident at 40°, and its intensity was varied in the range from 0.8 to 30 mW/cm². Emission was collected normal to the sample with an ƒ/2 lens and focused into a multimode fiber where it was directed to a monochromator equipped with a photomultiplier. Luminescence at this frequency was obtained as a function of sample electrical bias and optical bias intensity using a lock-in amplifier.

Luminescence data were obtained by staggering the data points in random fashion to avoid systematic error due to sample degradation over the course of the measurement. All luminescence trends were independent of modulation frequency in the range of 100 Hz to 100 kHz; data reported were obtained at 10 kHz. Electroluminescence intensity was measured using a calibrated Si photodiode, and spectra were obtained with a fiber-coupled spectrometer under DC current drive from a semiconductor parameter analyzer.

Figure 9:
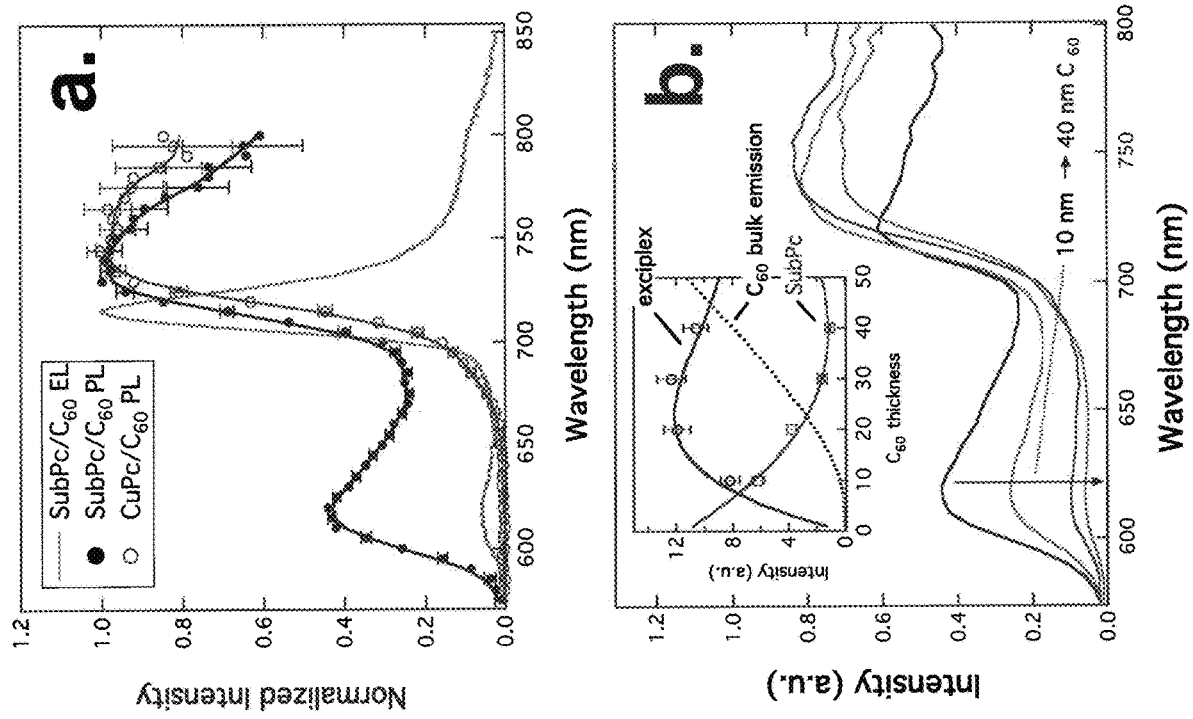
FIG. 9. (a) Shows the emission spectra of two solar cells as an embodiment of the present disclosure. The red solid line shows SubPc/$C_{60}$ electroluminescence obtained at a constant drive current of 450 mA/cm². Black closed and blue open circles denote SubPc/$C_{60}$ and CuPc/$C_{60}$ photoluminescence, respectively, excited at $\lambda_{ex}$=442 nm with a modulated intensity of 2 mW/cm² rms. (b) Shows the absolute SubPc/$C_{60}$ photoluminescence intensity measured for the following structure: BCP (10 nm)/$C_{60}$ (X nm)/SubPc (11 nm) deposited on quartz, where X=10, 20, 30, and 40 nm. Inset: Open circles and squares show the intensity for SubPc fluorescence and exciplex/fullerene emission integrated over the wavelength domains $\lambda_{em}$={575, 670} nm and $\lambda_{em}$={730, 800} nm, respectively. Lines indicate the predictions of a combined optical interference and diffusion model, where the exciplex emission is taken to be proportional to the exciton diffusive flux reaching the SubPc/$C_{60}$ interface. The fluorescence intensity of SubPc decreases in spite of its constant thickness due to an interference minimum that develops at its location as the $C_{60}$ thickness increases.

Emission spectra for both $CuPc/C_{60}$ and $SubPc/C_{60}$ devices are shown in FIG. 9a. The peak at $\lambda_{em}$=615 nm in both the photoluminescence (PL) and electroluminescence (EL) spectra of $SubPc/C_{60}$ corresponds to SubPc fluorescence. The electroluminescence peak at $\lambda_{em}$=715 nm is primarily due to fullerene fluorescence, as is the long wavelength shoulder at $\lambda_{em}$=800 nm. Overlapping emission from SubPc structural defects or aggregates may also contribute to the peak at $\lambda_{em}$=715 nm.

In contrast, the PL spectra of both $SubPc/C_{60}$ and $CuPc/C_{60}$ showed a significant redshift and broadening from the fullerene reference. This is ascribed to an interfacial $Pc/C_{60}$ exciplex in each case, noting that it is likely to be superimposed on a bulk fullerene fluorescence background. Similar exciplex emission red-shifted from the fullerene peak has been reported in porphyrin-fullerene systems, and has recently been established for several phthalocyanine-fullerene dyads as well.

FIG. 9b shows PL spectra obtained from a quartz/SubPc (11 nm)/$C_{60}$ (X nm)/BCP (10 nm) stack with excitation incident on SubPc through the substrate, where X=10, 20, 30, and 40 nm. The inset shows the intensity of SubPc fluorescence and exciplex/fullerene emission integrated over the wavelength intervals $\lambda_{em}$={575, 670 nm} and $\lambda_{em}$={730, 800 nm}, respectively, as a function of $C_{60}$ thickness. Lines indicate predictions based on an optical interference/diffusion model, where the exciton generation profile in each layer is calculated using the transfer matrix approach along with the optical constants of each layer. Exciplex emission intensity is assumed to be proportional to the diffusive exciton flux toward the heterointerface from both the SubPc and $C_{60}$ layers, whereas the fluorescence intensity from each layer is proportional its integrated exciton density. Literature reported diffusion lengths of 8 nm and 40 nm are used for SubPc and $C_{60}$, respectively.

FIG. 10a shows the emission intensity at $\lambda_{en}$=615 nm and $\lambda_{em}$=730 nm for the $CuPc/C_{60}$ and $SubPc/C_{60}$ HJs, respectively, as functions of electrical bias under a steady state illumination intensity of $I_{bias}$=10 mW/cm². Whereas SubPc fluorescence increases only slightly with increasing bias, the exciplex/fullerene emission at $\lambda_{em}$=730 nm increases linearly, peaks at $V_a$~0.5 V and then sharply decreases. This contrasts with the behavior of $CuPc/C_{60}$, whose exciplex/fullerene emission decreases under reverse bias for $V_a \gtrsim -0.4$ V, and continues before leveling off at $V_a$>0.5 V.

FIG. 10b shows the bias dependence of $SubPc/C_{60}$ exciplex/fullerene emission for $I_{bias}$=30 and 0.8 mW/cm². For the low intensity case, the probe modulation was decreased from 2 to 0.2 mW/cm² rms to maintain it as a small fraction of $I_{bias}$, resulting in a proportionately lower luminescence signal. The corresponding current-voltage characteristics, obtained at the same time as the luminescence, are also plotted in FIG. 10b (solid lines). The emission peaks determined by linear fitting of the two slopes evident in each trend, appear to correspond to the open-circuit voltage as identified by the minimum in the log(J) vs. V data.

Figure 11:
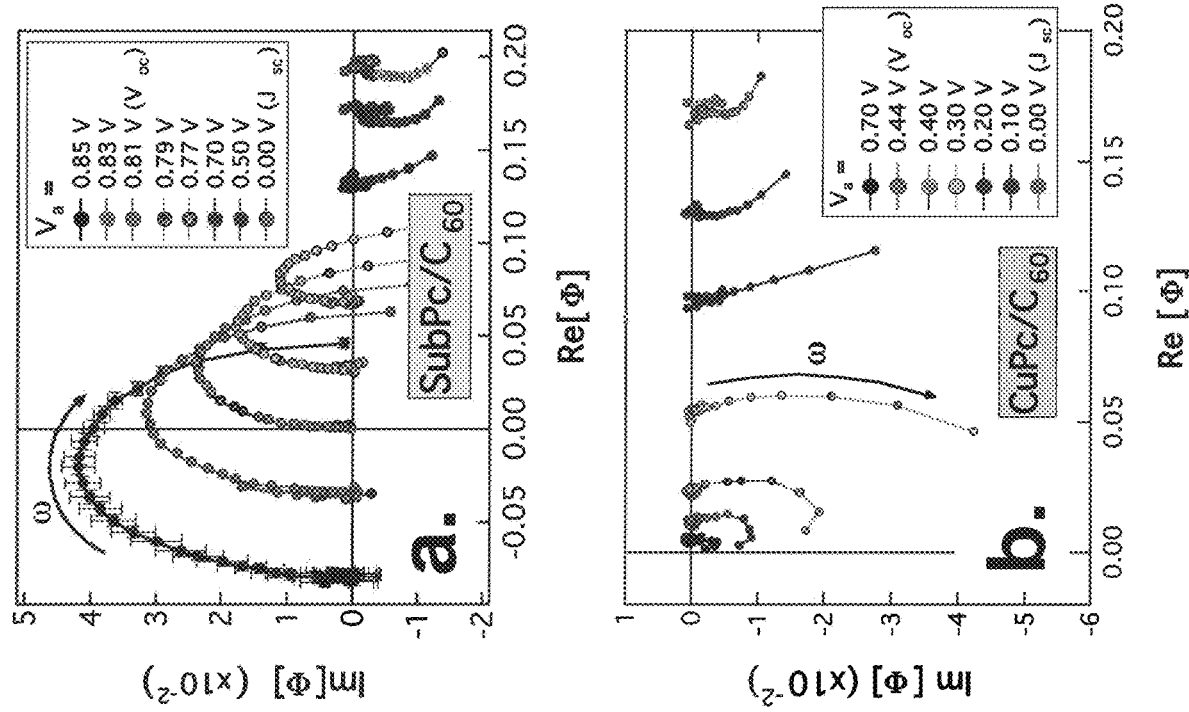
FIG. 11. (a) Is a Cole-Cole representation of intensity modulated photocurrent spectra (IMPS) for the SubPc/$C_{60}$ cell. Near short-circuit, the complex quantum efficiency, Φ accumulates a small phase lag with increasing modulation frequency due to the charge carrier transit time from the interface to the contacts. At open-circuit, Φ exhibits a phase advance due to superposition of an oppositely directed bimolecular recombination current at the heterojunction. (b) Similar IMPS spectra obtained for CuPc/C$_{60}$. The contraction $|\tilde{\Phi}| \to 0$ and lack of phase advance at open-circuit indicates that free carrier generation is suppressed due to geminate recombination.

Intensity modulated photocurrent spectra are shown for $SubPc/C_{60}$ in the Cole-Cole plot of FIG. 11a, with frequency was the implicit variable. At zero bias (short-circuit), $\tilde{\Phi}$ is purely real at low frequency, consistent with a steady-state external quantum efficiency of ~18% at $\lambda_{ex}$=496 nm. Negative phase accumulates with increasing frequency due to the charge carrier transit time delay from the interface to the contacts. This is typical of the IMPS response, similar to that observed in dye sensitized solar cells, although the phase lag here is smaller, and occurs at higher frequency due to the faster charge transport in organic thin films.

This behavior is maintained for increasing forward bias, with $|\tilde{\Phi}|$ decreasing as expected from the current-voltage characteristics. Near open-circuit conditions ($V_a$~$V_{oc}$=0.81 V), the response changes to a phase advance. Although the photocurrent appears to lead the optical signal, this is in fact a result of the superposition of a positive photocurrent (toward the contacts), and a negative recombination current (toward the interface). According to the crossover condition, $k_{rec}n_I\tau(1-\eta_{PPd})$>1 derived above, this indicates substantial bimolecular recombination (i.e. $k_{rec}n_I$ becomes large) at open-circuit in the $SubPc/C_{60}$ cell. FIG. 11b shows that the $CuPc/C_{60}$ device behaves similarly to $SubPc/C_{60}$ at short-circuit. At open-circuit ($V_a$=0.44 V), however, the $CuPc/C_{60}$ cell shows no phase advance, instead maintaining its short-circuit form as $|\tilde{\Phi}| \to 0$.

Figure 12:
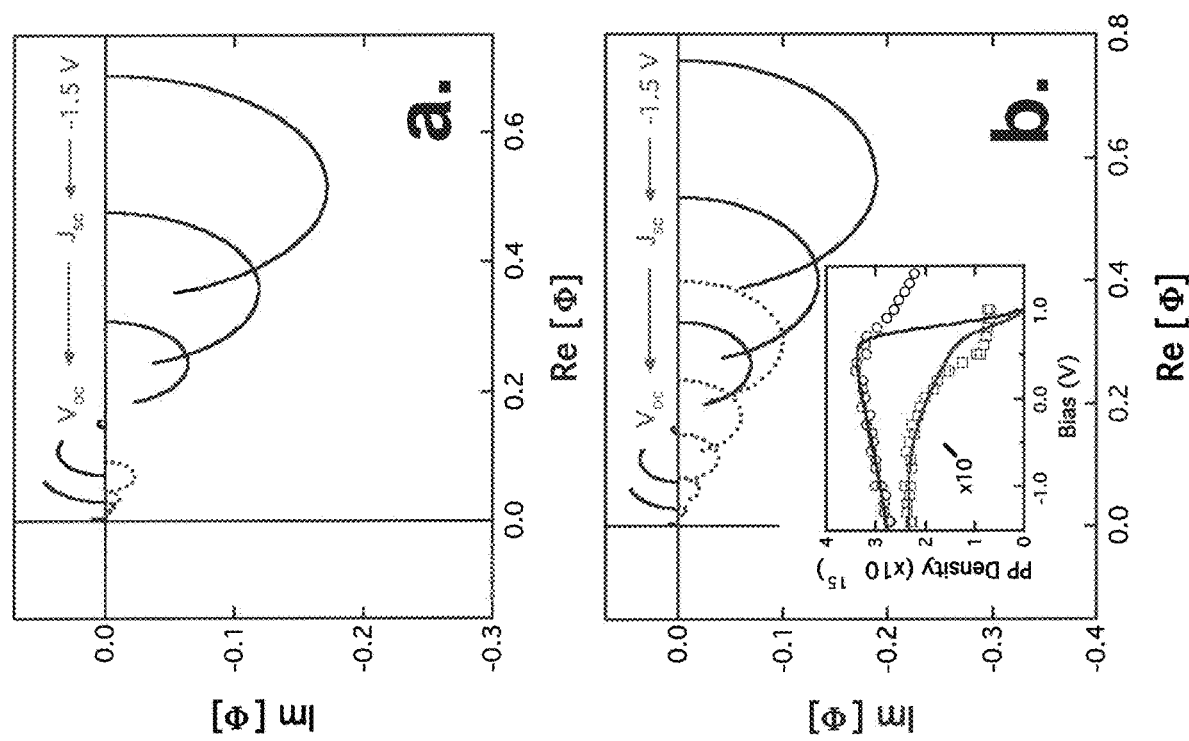
FIG. 12. (a) Shows the simulated IMPS spectra assuming constant $k_{PPr}$ (100 ns)$^{-1}$ (black solid lines) and 1 ns$^{-1}$ (blue dashed lines) using Eq. (23) in the text. (b) Shows the simulated IMPS spectra assuming the field-dependent form for $k_{PPr}$ as given by Eq. (24) in text. In this case, the zero-field rates are $k_{PPr0}$=(100 ns)$^{-1}$ (black solid lines) and 1 ns$^{-1}$ (blue dashed lines). The inset shows the predicted polaron pair density in each case (solid lines), that agree with the SubPc/C$_{60}$ (black circles) and CuPc/C$_{60}$ (blue squares) exciplex data of FIG. 10a, up to the open circuit voltage.

FIG. 12a shows IMPS spectra calculated from Eq. (23) assuming an initial polaron pair separation $a_0$=1.5 nm and two different constant values for the PP recombination rate, $k_{PPr}$. When $k_{PPr}$=(100 ns)$^{-1}$ (black lines), crossover from phase lag to phase advance is observed upon transition from $J_{sc}$ to $V_{oc}$, similar to that shown for $SubPc/C_{60}$ in FIG. 11a. If $k_{PPr}$ is increased to 1 ns$^{-1}$ (blue dashed lines), the modulus decreases at all values of bias, becoming small as $V_a \to V_{oc}$, where a small phase advance is still predicted.

FIG. 12b shows the change in IMPS signal that results from a field-dependent $k_{PPr}$ as given by Eq. (24), where the zero-field recombination rates of $k_{PPr0}$=(100 ns)$^{-1}$ (solid black lines) and $k_{PPr0}$=1 ns$^{-1}$ (dashed blue lines) have been maintained. Similar to FIG. 12a, black curves show a crossover in the IMPS response to a phase advance near open-circuit. Whereas the modulus of the blue dashed curves is more substantial at short circuit, it remains small in the vicinity of $V_{oc}$, similar to FIG. 12a.

Solid lines in the inset of FIG. 12b show the corresponding calculated PP densities, which are proportional to $(k_{PPd}+k_{PPr})^{-1}$. The exciplex luminescence data from FIG. 10a are reproduced and overlayed for comparison, showing agreement for $V \leq V_{oc}$. Similar calculations for the case of constant $k_{PPr}$ in FIG. 12a (not shown) fit poorly to the data over the entire range of bias.

According to Morteani et. al., excitons from the donor and acceptor bulk diffuse to the heterojunction where they undergo charge transfer and thermalize within the distance of a few molecular layers to form Coulombically bound geminate polaron pairs. These may dissociate in the electric field at the interface, or relax to neighboring donor and acceptor molecules, at which point they may form an exciplex or recombine to the ground state. Since polaron pairs are precursors to exciplex formation, and exciplex decay is expected to be largely field independent, the exciplex emission intensity provides a means for monitoring changes in the PP population at the HJ, which depends sensitively on the local electric field.

In this context, previous reports have observed exciplex emission for various Pc/$C_{60}$ molecular dyads that is red-shifted and broadened from the fullerene fluorescence peak at $\lambda_{em}$=715 nm. The intensity trend of this red-shifted peak with increasing $C_{60}$ thickness is directly proportional to the number of excitons that diffuse to the SubPc/$C_{60}$ interface, as shown in FIG. 1b. In contrast, fluorescence from the $C_{60}$ bulk is predicted to grow monotonically with $C_{60}$ thickness. Hence, SubPc/$C_{60}$ and CuPc/$C_{60}$ interfacial exciplexes constitute a significant component of the broad emission bands at $\lambda_{em}$~740-750 nm in their respective PL spectra of FIG. 1a. The exciplex is far more prominent in the PL spectrum of SubPc/$C_{60}$ than in its EL spectrum. This may be the case because the EL spectrum is measured at high current density (J=450 mA/cm$^2$), where hole injection beyond the heterojunction, leading to recombination in the $C_{60}$ bulk dominates over that at the interface.

The weak bias dependence of SubPc fluorescence at $\lambda$=615 nm in FIG. 10a is consistent with the strongly bound bulk exciton, in contrast to the exciplex emission at $\lambda$=730 nm (c.f. FIG. 9a), which varies significantly. As $V_a \rightarrow V_{oc}$ the magnitude of the internal field in the device decreases, reducing dissociation, and thereby leading to increased emission. The exciplex bias dependence is more pronounced than that of the SubPc bulk exciton due to the high field sensitivity of the PP precursor state.

Figure 10:
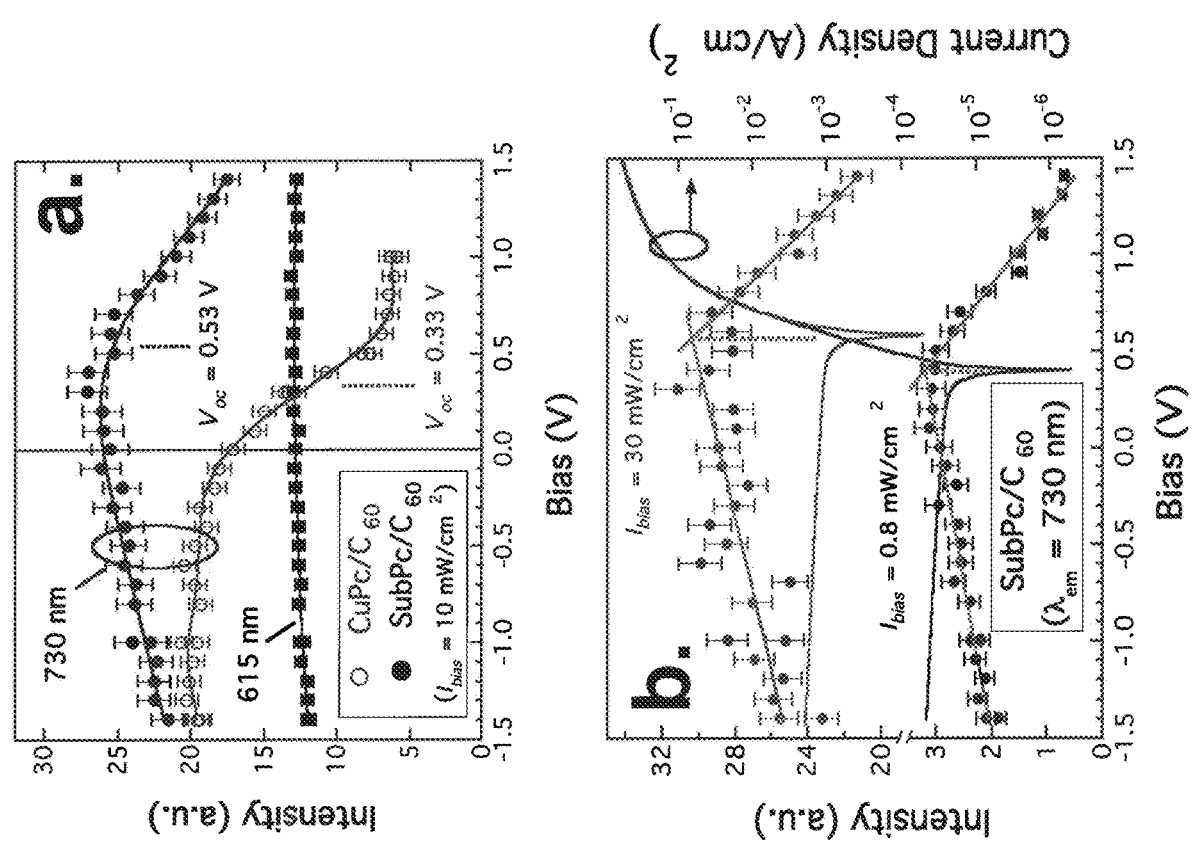
FIG. 10. (a) Represents the photoluminescence intensity as a function of electrical bias for CuPc/$C_{60}$ and SubPc/$C_{60}$ HJ devices obtained for a steady-state optical bias intensity of 10 mW/cm². The $\lambda_{em}$=730 nm trends follow the intensity of exciplex emission from the heterojunction of each cell, whereas the $\lambda_{em}$=615 nm trend follows the SubPc fluorescence intensity. Solid lines are guides for the eye. (b) Shows SubPc/$C_{60}$ exciplex emission for optical biases of 0.8 and 30 mW/cm², where emission from the 0.8 W/cm² bias has lower intensity because the modulated signal excitation beam was decreased from 2 to 0.2 mW/cm² to prevent it from dominating the optical bias. The current-voltage characteristics for each device, obtained concurrently with the luminescence data, are shown by solid lines, with the scale on the right hand ordinate. Red lines through the intensity data denote linear fits to estimate the emission peak positions, which scale with open-circuit voltage.

According to FIG. 10, the SubPc/$C_{60}$ exciplex emission, and hence the PP density at this HJ, peaks at $V_{oc}$. In contrast, the CuPc/$C_{60}$ exciplex trend indicates that the geminate PP density decreases long before reaching open-circuit. Since the PP density follows $\zeta \sim (k_{PPd}+k_{PPr})^{-1}$, this results from an increase in $k_{PPr}$ since $k_{PPd}$ decreases in moving from reverse bias to open-circuit due to the decrease in internal field. Therefore, SubPc/$C_{60}$ PPs are dominated by the field dependence of dissociation ($k_{PPd}$), whereas those of CuPc/$C_{60}$ are dominated by the field dependence of recombination ($k_{PPr}$).

The IMPS spectra of FIGS. 11a and 11b are also consistent with this interpretation. Both CuPc/$C_{60}$ and SubPc/$C_{60}$ show external quantum efficiencies of approximately 20% at short circuit, indicating that PP dissociation yields there are high ($k_{PPd}$>$k_{PPr}$). Near open-circuit, the SubPc/$C_{60}$ IMPS spectrum shows a phase advance, indicating a significant increase in the interfacial free carrier concentration according to the crossover condition derived above. The non-vanishing IMPS modulus also indicates that $\eta_{PPd}$ remains substantial (c.f. Eq. (23)), which in turn implies that $k_{PPd}$ is comparable to $k_{PPr}$.

In contrast, the phase lag and steady decrease in modulus of the CuPc/$C_{60}$ spectrum from short-circuit to open-circuit indicates that $\eta_{PPd}$ becomes very small over this same interval. Hence, the IMPS spectra show that the ratio, $k_{PPd}/k_{PPr}$, decreases more strongly for CuPc/$C_{60}$ between short- and open-circuit conditions than it does for SubPc/$C_{60}$, consistent with the interpretation of the exciplex luminescence trends.

This difference is evident in the simulated IMPS spectra of FIG. 12a, calculated according to Eq. (23) for the two cases of $k_{PPr}$=(100 ns)$^{-1}$ and $k_{PPr}$=1 ns$^{-1}$. The smaller recombination rate allows for a high dissociation yield at short-circuit, and leads to an IMPS crossover similar to that observed for SubPc/$C_{60}$. The fast recombination rate $k_{PPr}$=1 ns$^{-1}$ leads to a vanishing IMPS modulus at $V_{oc}$, as seen for CuPc/$C_{60}$, but also causes a significant decrease in the short-circuit quantum yield, in contrast to that observed for this device. Thus, a constant $k_{PPr}$ cannot reconcile the large short-circuit quantum yield and vanishing open-circuit IMPS modulus observed for CuPc/$C_{60}$.

Therefore, this evidence suggests that the recombination rate changes with bias, and thus depends on electric field. Such field-dependence is often observed for donor-acceptor dyads in solution, where recombination of the charge-transfer excited state depends strongly on solvent polarity, and hence on the local electric field that is induced.

Figure 13:
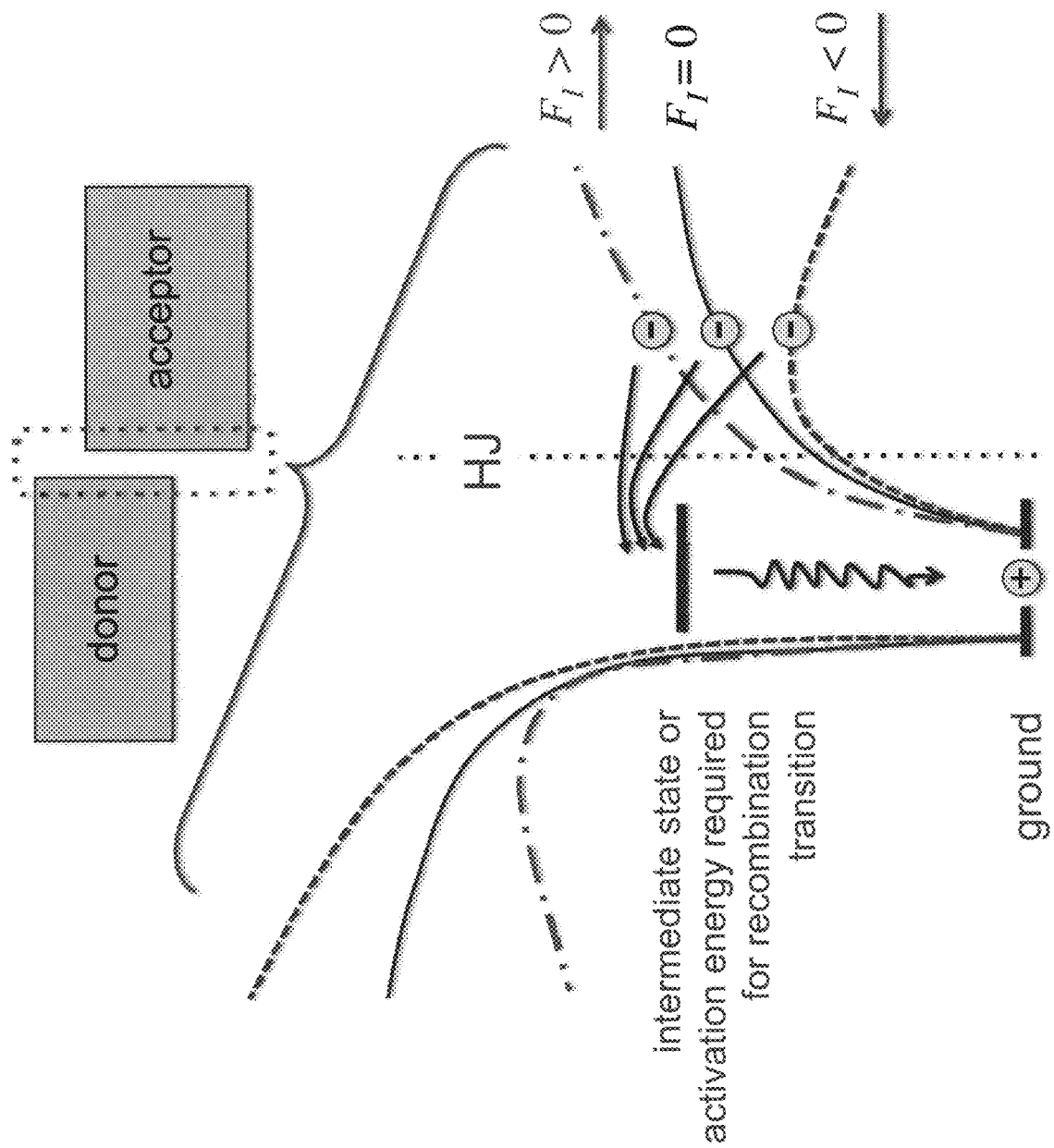
FIG. 13. Represents a proposed field-dependent model of the recombination rate, $k_{PPr}$. The interfacial electric field modifies the polaron pair potential, and hence the activation energy required for polaron pair recombination. In reverse bias, $F_I<0$, reducing the PP potential to favor dissociation and increasing the barrier for recombination. As $F_I$ increases, the dissociation rate decreases and the recombination rate increases. The polaron pair Coulomb potential is asymmetric due to the offset between donor and acceptor lowest unoccupied molecular orbitals, whose energy scheme is shown at the top of the figure.

Equation (24) suggests a simple form for the field dependence of $k_{PPr}$, where the change in polaron pair potential with field modifies the activation energy barrier required for the transition, as shown schematically in FIG. 13. In reverse bias, $F_I$<0 lowers the potential of the PP, decreasing the recombination rate, whereas in forward bias, $F_I$>0 increases it. The potential shift typically ranges from −0.1 to 0.1 eV, and hence can significantly change the recombination rate at room temperature, especially approaching open-circuit where $F_I$ changes rapidly with applied voltage.

Marcus theory provides a more rigorous basis for the field-dependence of the recombination rate, where the driving force for the transition, $\Delta G$, is modified by the change in PP potential. In the normal region, the driving force increases with $F_I$ and the field dependence of $k_{PPr}$ is similar to that given by Eq. (24). In the inverted region, however, increasing $F_I$ slows the recombination rate and vice versa. Since the recombination pathways and their associated free energies are not well established for the two HJs studied here, the Marcus formulation involves too many unknowns, and hence Eq. (24) was used as a reasonable approximation.

Simulating the IMPS spectra and PP density in FIG. 4b with the field-dependent $k_{PPr}$ as given by Eq. (24) results in trends that provide a qualitative match to the data. Using $k_{PPr0}$=(100 ns)$^{-1}$ reproduced the observed IMPS spectrum and, in the inset, predicted a PP density that follows the SubPc/$C_{60}$ exciplex emission trend for V<$V_{oc}$. Alternatively, when $k_{PPr0}$=1 ns$^{-1}$, the calculated PP density starts to decline under reverse bias, in reasonable agreement with the CuPc/$C_{60}$ exciplex trend, where the emission floor observed for $V_a$>0.5 V probably reflects the base fullerene fluorescence component, and not a leveling off of the exciplex emission. The field-dependent $k_{PPr}$ also expands the modulus of the simulated IMPS spectra at $J_{sc}$ while maintaining its vanishing modulus at open circuit, in better agreement with the CuPc/$C_{60}$ data of FIG. 11b.

The model for the PP density breaks down beyond $V_{oc}$ as the predicted density decreases more rapidly than the data in the inset of FIG. 12b. In this region, $k_{PPr}$>$k_{PPd}$; hence deviations from the approximation in Eq. (24) result in larger errors in the predicted PP density than when $k_{PPr}$<$k_{PPd}$ at V<$V_{oc}$. Additionally, other physical mechanisms may play a role. For example, carriers may undergo drift during thermalization, leading to a distribution of initial PP separations that is field dependent. Alternatively, the rate of exciton dissociation at the interface can also be field-dependent, where $F_I$<0 (i.e., opposite to the direction aiding dissociation) decreases the free energy that drives the initial charge transfer step.

The variation observed in $k_{PP_r}$ has consequences for solar cell performance. As discussed above, the decrease in open-circuit voltage from its theoretical $V_{oc}^{max}$, depends on $\ln(k_{PP_r}/k_{PP_d})$. High recombination rate is consistent with the IMPS and exciplex observations for CuPc/C$_{60}$. Indeed, the approximately 100-fold difference in recombination rate that distinguishes the trends for SubPc/C$_{60}$ and CuPc/C$_{60}$ translates to a ~0.25 V decrease in $V_{oc}$ at room temperature (see Eq. (17), above) in these devices. Hence, the fast recombination rate largely explains why CuPc/C$_{60}$ cells operate at approximately 0.3 V below their $V_{oc}^{max}$, whereas SubPc/C$_{60}$ cells reach their maximum under standard operating conditions.

There are several possible routes to reduce $k_{PP_r}$ and thus improve cell efficiency. For example, the electronic coupling upon which $k_{PP_r}$ depends can be decreased by adding steric bulk to D and A molecules at the interface or by disrupting their ordered stacking as suggested previously. Only interfacial molecules within a distance ~$a_0$ of the HJ participate in the recombination process. Hence, the bulk of the D and A layers need not be altered from compositions or stacking habits that promote charge transport and exciton diffusion Investigation of geminate polaron pair recombination in archetype CuPc/C$_{60}$ and SubPc/C$_{60}$ organic heterojunction solar cells using intensity modulated photocurrent spectroscopy, and measuring the emission from interfacial exciplex states has been provided. Also, provided is the nature of polaron pair recombination in both material systems, and validation of the rate-based model of PP dynamics used to derive the ideal diode equation for organic HJs. The PP density in SubPc/C$_{60}$ peaks near open circuit, and is dominated by dissociation kinetics between V=0 and $V_{oc}$, whereas that of CuPc/C$_{60}$ decreases due to increasing recombination over this interval. An expression for the recombination rate that explains this behavior and qualitatively describes both the IMPS and exciplex luminescence trends observed for each cell are discussed above.

As provided herein, polaron pair recombination dynamics significantly impact the efficiency and open circuit voltages of organic solar cells. While this behavior for two small-molecule based cells has been provided, the techniques employed here are general, and may be applied to non-planar, bulk heterojunction devices based on, for example, small molecules or polymers.

An analytical model that describes the current-voltage characteristics of organic heterojunctions is provided herein. The model was based on polaron pair generation and recombination processes at the donor-acceptor interface, and leads to an ideal diode equation that is generally applicable to both polymer and small molecular weight, organic planar and bulk heterojunctions. The dark current is shown to be directly proportional to the polaron pair recombination rate, and the open-circuit voltage is ultimately limited by the difference between the donor-acceptor interface energy gap and the polaron pair binding energy, as observed previously.

It was proposed that recombination at traps within the disorder-induced density of states tail in each material at the D-A heterointerface results in two, temperature-dependent ideality factors, and a commonly observed double exponential J-V characteristic. Using an exponential trap distribution, the trends observed for the dark current, $V_{oc}$, and $J_{sc}$ as a function of temperature and intensity have been reproduced herein.

Thus, the aforementioned disclosure provides, in part, the following interpretation of the current vs. voltage characteristics: (1) The reverse bias slope of the dark current reflects the increasing dissociation probability of thermally generated PPs at the HJ; (2) in forward bias, there are two exponential regions, each with its own ideality factor stemming from recombination with trapped/immobile carriers at each side of the HJ; (3) the ideality factors are interpreted as the extent to which trap-limited recombination (one free and one immobile carrier) dominates over free carrier recombination (both carriers mobile); (4) the ratio of the two exponential current components under forward bias reflects the relative contribution of free donor holes recombining with trapped acceptor electrons vs. the reverse process to the total current density; (5) large ideality factors (>2) are due to a broad trap DOS distribution and/or large asymmetries in the potential dropped across the donor and acceptor layers; and (6) both ideality factors increase with decreasing temperature as more carriers freeze into the DOS tail and trap-limited recombination increases.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. An organic photosensitive optoelectronic device comprising:
    two electrodes in superposed relation;
    at least one donor material, and
    at least one acceptor material,
    said at least one donor material and at least one acceptor material forming at least one photoactive region between the two electrodes,
    wherein said at least one donor material and at least one acceptor material each comprises at least one of a single crystalline, nanocrystalline, and polycrystalline material in the bulk of the respective donor and acceptor materials,
    wherein the at least one donor material and the at least one acceptor material form a steric bulk region at the interface of the donor and acceptor materials, and
    wherein the steric bulk region comprises both molecules of the donor material and the acceptor material that have increased steric bulk compared to molecules of the donor material and the acceptor material outside of the steric bulk region.

2. The device of claim 1, wherein said steric bulk region comprises less than ten monolayers of said donor material and/or said acceptor material.

3. The device of claim 1, wherein the photo-active region forms at least one of a mixed heterojunction, bulk heterojunction, nanocrystalline-bulk heterojunction, and hybrid planar-mixed heterojunction.

4. The device of claim 1, wherein the donor material is chosen from subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ).

5. The device of claim 1, wherein the acceptor is chosen from C$_{60}$, C$_{70}$, 3,4,9,10 -perylenetetracarboxylicbis-benzimidazole (PTCBI), PCBM, PC70BM and hexadecafluorophthalocyanine (F$_{16}$CuPc).

6. The device of claim 1, wherein at least one electrode comprises transparent conducting oxides or transparent conducting polymers.

7. The device according to claim 6, wherein the conducting oxides are chosen from indium tin oxide (ITO), tin oxide (TO), gallium indium tin oxide (GITO), zinc oxide (ZO), and zinc indium tin oxide (ZITO), and the transparent conductive polymers comprise polyanaline (PANI).

8. The device according to claim 1, wherein at least one electrode comprises a metal substitute, a non-metallic material or a metallic material chosen from Ag, Au, Ti, Sn, and Al.

9. The device of claim 1, further comprising at least one exciton blocking layer.

10. The device of claim 9, wherein said exciton blocking layer is chosen from bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium (III) (Ru(acaca)$_3$), and aluminum(111)phenolate (Alq$_2$ OPH).

11. The device of claim 1, wherein the device is an organic photodetector.

12. The device of claim 1, wherein the device is an organic solar cell.

13. A method of making an organic photosensitive optoelectronic device, said method comprising depositing onto a substrate at least one donor material, at least one acceptor material, and two electrodes,
wherein said at least one donor material and at least one acceptor material are deposited to form at least one photoactive region between the two electrodes,
wherein said at least one donor material and at least one acceptor material each comprises at least one of a single crystalline, nanocrystalline, and polycrystalline material in the bulk of the respective donor and acceptor materials,
wherein the at least one donor material and the at least one acceptor material form a steric bulk region at the interface of the donor and acceptor materials, and
wherein the steric bulk region comprises both molecules of the donor material and the acceptor material that have increased steric bulk compared to molecules of the donor material and the acceptor material outside of the steric bulk region.

14. The method of claim 13, wherein said steric bulk region comprises less than ten monolayers each of said donor material and/or said acceptor material.

15. The method of claim 13, wherein said depositing occurs in a vacuum.

16. The method of claim 13, wherein the photo-active region forms at least one of a mixed heterojunction, bulk heterojunction, nanocrystalline-bulk heterojunction, and hybrid planar-mixed heterojunction.

17. The method of claim 13, wherein the donor layer is chosen from subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ).

18. The method of claim 13, wherein the acceptor is chosen from C6o, C7o, 3,4,9,10-perylenetetracarboxylicbis-benzimidazole (PTCBI), PCBM, PC70BM and hexadecafluorophthalocyanine ($F_{16}$CuPc).

19. The method of claim 13, wherein the at least one electrode comprises a metal substitute, a non-metallic material or a metallic material chosen from Ag, Au, and Al.

20. The method of claim 13, further comprising depositing at least one exciton blocking layer between the substrate and the electrode, wherein said exciton blocking layer is chosen from bathocuproine (BCP), bathophenanthroline (BPhen), 3,4,9,10-perylenetetracarboxylicbis-benzimidazole (PTCBI), 1,3,5-tris(N-phenylbenzimidazol-2-yl) benzene (TPBi), tris(acetylacetonato) ruthenium(III) (Ru(acaca)$_3$), and aluminum(lll)phenolate (Alq2 OPH).

21. The method of claim 13, wherein at least one electrode comprises transparent conducting oxides or transparent conducting polymers.

22. The method of claim 21, wherein the substrate comprises a conducting oxide chosen from indium tin oxide (ITO), tin oxide (TO), gallium indium tin oxide (GITO), zinc oxide (ZO), and zinc indium tin oxide (ZITO), and the transparent conductive polymers comprises polyanaline (PANT).

* * * * *